(12) United States Patent
Tanaka et al.

(10) Patent No.: US 6,703,328 B2
(45) Date of Patent: Mar. 9, 2004

(54) SEMICONDUCTOR DEVICE MANUFACTURING METHOD

(75) Inventors: Toshihiko Tanaka, Tokyo (JP); Takashi Hattori, Musashimurayama (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/044,987

(22) Filed: Jan. 15, 2002

(65) Prior Publication Data

US 2002/0102477 A1 Aug. 1, 2002

(30) Foreign Application Priority Data

Jan. 31, 2001 (JP) ........................ 2001-024092

(51) Int. Cl.[7] .......................... H01L 21/027; G03C 5/56
(52) U.S. Cl. ...................... 438/942; 430/311
(58) Field of Search ................. 438/462, 401, 438/942, 945, 948, 950, 975; 257/797; 430/5, 215, 270.1, 311

(56) References Cited

U.S. PATENT DOCUMENTS

| | | | | |
|---|---|---|---|---|
| 4,757,355 A | * | 7/1988 | Iizuka et al. ................ 355/75 |
| 5,945,238 A | * | 8/1999 | Huggins et al. ................ 430/5 |
| 6,177,231 B1 | * | 1/2001 | Ishii et al. ................ 430/273.1 |
| 6,303,262 B1 | * | 10/2001 | Takaoka et al. ............ 430/231 |
| 6,306,549 B1 | * | 10/2001 | Baracchi ........................ 430/5 |
| 6,399,283 B1 | * | 6/2002 | Hoshi .......................... 430/312 |
| 2001/0005565 A1 | * | 6/2001 | Fujimoto ........................ 430/5 |

FOREIGN PATENT DOCUMENTS

| | | |
|---|---|---|
| JP | 5-289307 | 11/1993 |
| JP | 2000-91192 | 3/2000 |

* cited by examiner

*Primary Examiner*—Carl Whitehead, Jr.
*Assistant Examiner*—Jennifer M Dolan
(74) *Attorney, Agent, or Firm*—Miles & Stockbridge P.C.

(57) ABSTRACT

A circuit pattern, a reticle alignment mark, a bar code, and a discrimination mark which are formed on a glass plate of a photo mask is constituted of a photo sensitive and photo attenuative material containing a fine particle material and a binder. Discrimination of the photo mask is performed by irradiating predetermined discrimination light on the discrimination mark or the bar code. Alignment of the photo mask by an aligner is performed by irradiating predetermined detection light on the reticle alignment mark. In an exposure process, the pattern on the photo mask is transferred onto a semiconductor wafer by using exposure light having a wavelength different from that of the discrimination light or that of the detection light.

19 Claims, 14 Drawing Sheets

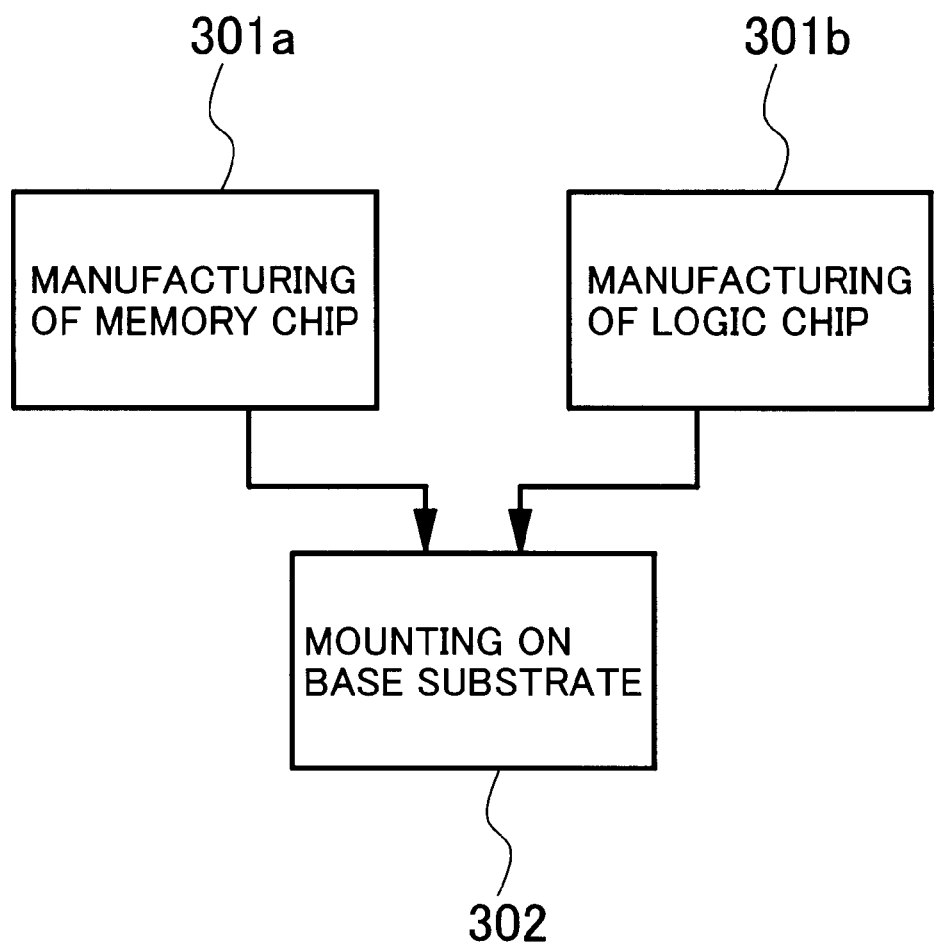

SEMICONDUCTOR DEVICE MANUFACTURING METHOD

TECHNICAL FIELD OF THE INVENTION

The present invention relates to a technique for manufacturing a semiconductor device and, more particularly, to a technique which is effectively applied to a lithography technique in the steps of manufacturing a semiconductor device.

BACKGROUND OF THE INVENTION

In manufacturing semiconductor devices including an LSI (LARGE SCALE INTEGRATED CIRCUIT) or the like, a lithography technique is used as a method of forming a micropattern on a semiconductor wafer. As this lithography technique, a so-called optical projection exposure method in which patterns formed on photo masks are repeatedly transferred onto a semiconductor wafer through a reduction projection optical system is the mainstream. A basic configuration of an aligner is disclosed in, e.g., Japanese Patent Application Laid-Open No. 2000-91192.

A resolution R on the semiconductor wafer in the projection exposure method is generally expressed by $R=k\times\lambda/NA$. In this equation, reference symbol k denotes a constant depending on a resist material or a process, reference symbol $\lambda$ denotes the wavelength of illumination light, and reference symbol NA is the numerical aperture of a projection exposure lens. As is apparent from this relational equation, with an advance of micropatterning, a projection exposure technique source having a shorter wavelength is necessary. At the present, an LSI is manufactured by a projection aligner using a g-ray ($\lambda$=438 nm), an i-ray ($\lambda$=365 nm) of a mercury lamp, or a KrF excimer laser ($\lambda$=248 nm) as an illumination light source. In order to realize further micropatterning, the employment of an ArF excimer laser ($\lambda$=193 nm) or an $F_2$ excimer laser ($\lambda$=157 nm) having a shorter wavelength has been examined. However, in general, the costs and maintenance cost of the aligner and the processes increase as the wavelength becomes short. For this reason, a plurality of exposure light sources are combined to each other to manufacture a semiconductor device. As a typical example, a semiconductor device is manufactured in such a manner that an i-ray and a KrF excimer laser are selectively used depending on the steps of manufacturing the semiconductor device.

A general photo mask has a structure in which a thin film made of chromium or the like is formed as a shield film on a quartz glass plate which can transmit exposure light. Such a photo mask is manufactured in the following manner. That is, a resist is coated on a quartz glass plate obtained by forming a chromium film on a quartz plate, the resultant quartz glass plate is exposed in the shape of a prepared desired pattern and developed to form a resist pattern, and chromium is etched by using the resist pattern as an etching mask.

On the other hand, for example, in Japanese Patent Application Laid-Open No. 5-289307, a photo mask in which a resist is used as a shield film in place of a chromium film. This is a photo mask using the fact that the photoresist has a low transparency with respect to short-wavelength light such as ArF light.

Incidentally, a machining precision of a mask pattern on a photo mask has become severer with the advance of micropatterning in manufacturing a semiconductor device. At the same time, the problem of an increase in cost for manufacturing a photo mask with an increase in the amount of pattern data has become conspicuous. In general, since 20 to 40 photo masks are used to manufacture one type of semiconductor device, the increase in cost for manufacturing a photo mask is a considerably serious problem. In addition, in a system LSI, it is demanded to rapidly supply customized products in line with the demands of customers. In order to accede to the demand, necessity to prepare a photo mask having a desired pattern in a short TAT has increased. Furthermore, since production cycles of not only LSIs but also other semiconductor devices become short, a TAT for developing LSIs is strongly required to be short. Also in this sense, necessity of preparing a photo mask having a desired pattern for a short TAT has been increased. In particular, a debug rate of a wiring layer is high in a system LSI. For this reason, to supply the mask of this layer in a short period of time at low cost is useful to develop an LSI in a short period of time and to reduce the costs.

A photo mask disclosed in Japanese Patent Application Laid-Open No. 5-289307 can be manufactured without the step of etching chromium. For this reason, the effect of a reduction in mask cost can be expected. In addition, since the manufacturing steps do not include the process of etching chromium, it is also advantageous for assuring the precision of pattern dimensions. Also, since the photo mask can be manufactured without the step of etching chromium, a TAT for manufacturing a photo mask is short.

However, the inventors of this invention found that a photo mask technique using the resist as a shield material had the following problems.

Specifically, in Japanese Patent Application Laid-Open No. 5-289307, a technique in which a pattern is transferred onto a semiconductor wafer by using a photo mask having a shield pattern constituted of a resist film is disclosed. However, any pattern monitoring technique on a photo mask such as an alignment monitoring technique for a photo mask or a discriminator monitoring technique is not disclosed, and a description which suggests the pattern monitoring technique is not made therein.

When a semiconductor device is manufactured as described above, a large number of photo masks usually 20 to 40 photo masks are required, and alignment must be performed. Therefore, alignment mark monitoring for aligning patterns formed of the photo masks is required. Since a large number of photo masks are used, mask management using discrimination codes of the photo masks such as the names, lot numbers, or bar codes of the photo masks is required. In general, light having a wavelength longer than 240 nm such as halogen light, red diode light, or a helium-neon (He—Ne) laser beam is used to monitor photo mask alignment marks and discriminators. However, according to the examination result obtained by the inventors of this invention, as shown in FIG. 14, it was found out that a general resist material was unable to obtain sufficient shield properties for light having a wavelength longer than 230 nm and did not sufficiently function as a shield material. For this reason, when alignment marks or discriminators are formed of resists, shielding properties and light-absorbing properties are so insufficient that discrimination, recognition, or monitoring is made difficult.

Specifically, in the technique in the gazette which discloses a photo mask using the resist as a shield material, alignment mark monitoring and discriminator monitoring on a photo mask are not considered at all. For this reason, patterns obtained by different photo masks are offset from each other, and it is impossible to discriminate the photo masks, resulting that the photo masks can not be easily managed. No consideration is given to these problems, in particular, to the problem of the mask discrimination, in the gazette which discloses the photo mask using the resist as a shield material.

FIG. 14 shows an OD value of the resist obtained when using a phenol resin as a base resin. The OD value is a value expressed by –LOG 10 (I OUT/I IN) when incident light and transmitted light are represented by I IN and I OUT, respectively. Since a transmittance T% is expressed by 100×I OUT/I IN, OD is expressed by –LOG (T/100) is satisfied. As the OD value increases, the transmittance of light decreases. In this case, for the sake of descriptive convenience, the film thickness of the resist is set to be 1 μm. When the resist is used as the photo mask, the film thickness is generally set to be 0.5 μm or less so as to prevent the film thickness of the resist from adversely affecting transfer characteristics. When the film thickness is 0.5 μm, the OD value is ½. In a resist containing a normal benzene ring, in almost the same way as that in FIG. 14, the OD value is small when light having a wavelength longer than 230 nm is used, that is, since a transmittance is small, the resist film does not sufficiently function as a shield film.

With respect to mask alignment, a method in which an outer frame made of metal is used and a mask alignment mark is put thereon is known. In this method, however, alignment exposure between the pattern formed on the outer frame and the circuit pattern is required disadvantageously.

SUMMARY OF THE INVENTION

It is an object of the present invention to provide a technique which can easily perform discrimination of a photo mask.

It is another object of the present invention to provide a technique which can preferably align photo masks to each other.

The above and other objects, and the novel characteristic feature of the present invention will be apparent from the description of this specification and the accompanying drawings.

The outline of typical ones of the inventions disclosed in this application will be described below.

Specifically, according to an aspect of the present invention, there is provided a semiconductor device manufacturing method, in which a circuit pattern, an alignment mark, and a discrimination mark which are formed on a photo mask and are constituted of the same photo sensitive and photo attenuative material, including: the step of discriminating the photo mask by using the discrimination mark; the step of aligning of the photo mask by using the alignment mark; and the step of transferring a pattern onto a semiconductor wafer by the circuit pattern.

According to another aspect of the present invention, there is provided a semiconductor device manufacturing method including: (a) the step of storing a photo mask having a transparent substrate and a photo sensitive and photo attenuative material in a stocker; (b) the step of reading a mark constituted of the photo sensitive and photo attenuative material to perform mask discrimination of the photo mask; (c) the step of installing the photo mask to a predetermined exposure unit of an aligner; (d) the step of monitoring the position of an alignment mark constituted of the photo sensitive and photo attenuative material on the photo mask to perform alignment between the photo mask and the semiconductor wafer; (e) the step of exposing a desired pattern of the photo mask on the semiconductor wafer by the aligner; and (f) the step of installing the photo mask to the stocker after predetermined exposure is performed, wherein the photo sensitive and photo attenuative material has a transmittance of not more than 60% with respect to light which performs the mask discrimination and light which monitors the alignment marks.

BRIEF DESCRIPTION OF THE DRAWINGS

FIG. 12 is a flow chart for explaining a manufacturing flow of a semiconductor device according to still another embodiment of the present invention.

DETAILED DESCRIPTION OF THE PREFERRED EMBODIMENTS

Figure 1:
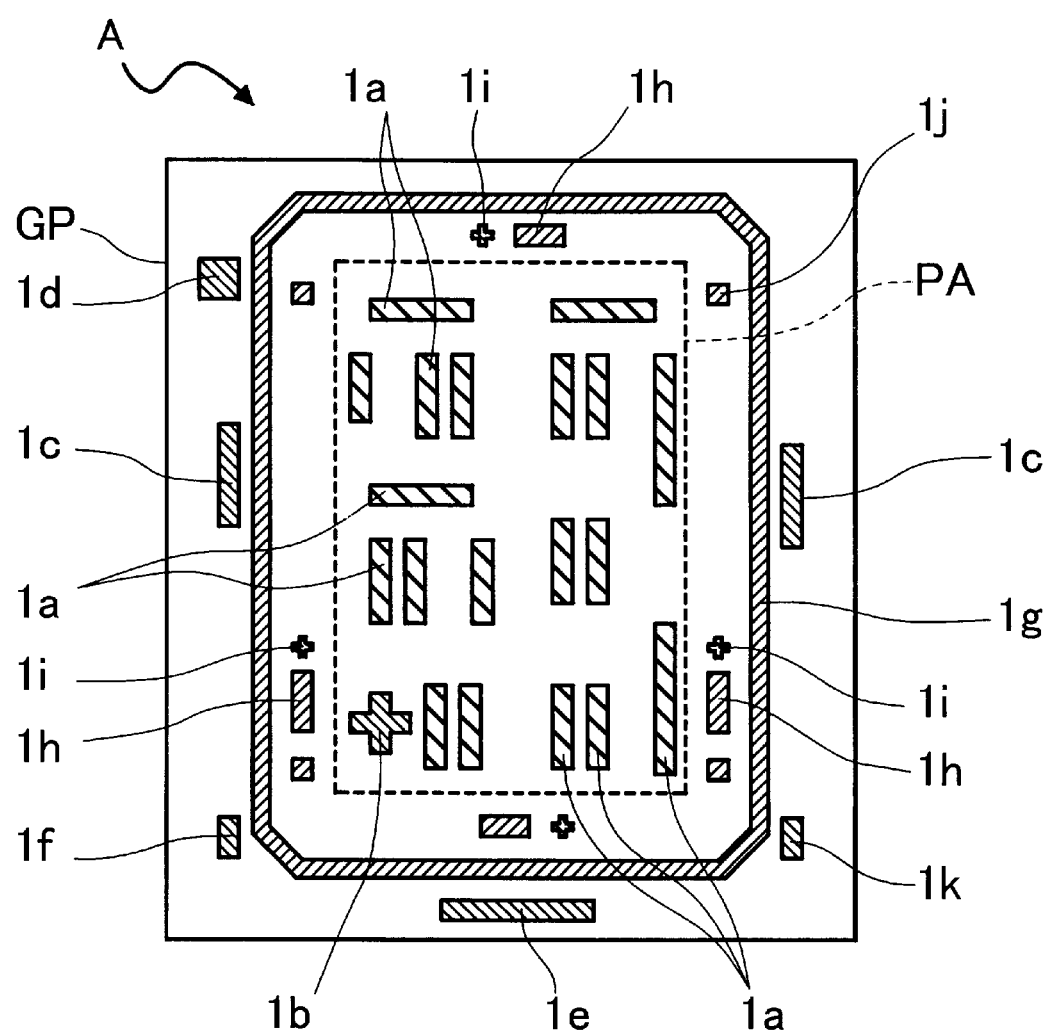
FIG. 1 is a plan view of a photo mask used in the steps of manufacturing a semiconductor device according to an embodiment of the present invention.

In the following embodiments, if necessary for the sake of descriptive convenience, the invention will be described in a plurality of sections or embodiments. However, unless otherwise stated, these sections or embodiments are related to each other, one constitutes part or all of modifications, details, complementary explanations, and the like of the other.

In the following embodiments, when the number of elements and the like (including the number of elements, numeral values, quantities, ranges, and the like) are mentioned, unless otherwise stated and unless these numbers are theoretically limited to specific numbers, these numbers are not limited to the specific numbers and may be equal to, larger than, or smaller than the specific numbers.

In addition, in the following embodiments, the constituent elements (also including essential steps or the like), unless otherwise stated and unless these constituent elements are theoretically apparently necessary, these constituent elements are not always necessary, as a matter of course.

Similarly, in the following embodiment, when the shapes and the positional relationship of the constituent elements or the like are mentioned, unless otherwise stated and unless the shapes, the positional relationship, and the like are theoretically wrong, shapes and the like which are substantially similar or approximate to the shapes and the likes are included. This is also applied to the numeral values and the ranges.

The same reference numerals as in all the drawings for explaining the embodiment denote the same parts having the same functions in all the drawings, and a repetitive description thereof will be omitted.

In the drawings used in the embodiment, even though a plan view is used, shield parts (a shield film, a shield pattern, a shield region, and the like) and a resist film may be hatched to easily see the plan view.

In the embodiments, a MISFET (METAL INSULATOR SEMICONDUCTOR FIELD EFFECT TRANSISTOR) serving as a typical example of field effect transistors is abbreviated as a MIS, a p-channel MISFET is abbreviated as a pMIS, and an n-channel MISFET is abbreviated as an nMIS.

The embodiment will be described below with reference to the accompanying drawings. Note that a photo attenuative material is a film having a transmittance of light of 60% or less. The photo attenuative material also includes a so-called shield material as one form of the photo attenuative material. A photo mask (to be referred to as a mask hereinafter) also includes a reticle.

A photo sensitive and photo attenuative material will be described below prior to the description of the embodiment.

The photo sensitive and photo attenuative material is formed to have a transmittance of 60% or less with respect to light which discriminates masks and light which monitors an alignment mark. As the photo sensitive and photo attenuative material, a photo sensitive material essentially consisting of a fine particle material and a binder, a resist containing a light-absorbing agent, or the like is used. As the fine particle material, inorganic fine particles are known. Specifically, fine particles of carbon such as carbon black or graphite, fine particles of a metal oxide such as titanium oxide, aluminum oxide, or zinc oxide, or fine particles of metal such as aluminum, gold, silver, or copper can also be used.

Also, a binder used in the embodiment functions to combine the fine particle materials to each other to form a film. As the binder, a polymer compound or an organic compound is known. When a mask of the embodiment is to be formed, a shield pattern is formed by an active radiation. For this reason, a binder having some photosensitivity with respect to a radiation, i.e., a resist material is preferably used as the binder used in the embodiment.

Preparation of materials of such a photo sensitive and photo attenuative material will be described below.

Preparation Example 1

Seventy-five grams of a carbon black dispersion (carbon black particle size of about 20 nm and content of 20 wt %) containing: 10 g of polyhydroxystyrene (weight-average molecular weight of about 20,000); 4 g of 2,6-bis(4-azidebenzal)acetone-2,2'-disulfonic acid-N,N-diethyleneoxyethylamide; and propylene glycol methyl ether acetate (PGMEA) used as a solvent was prepared, and 1.5 g of hexamethoxymethylmelamine and PGMEA used as a solvent was further added to the carbon black dispersion to prepare a resist (I) in which carbon having a solid content of 16% was diffused.

Preparation Example 2

Fifty grams of a carbon black dispersion (carbon black particle size of about 20 nm and content of 17 wt %) containing: 12 g of p-poly(p-hydroxystyrene-co-t-butylacrylate) (molar ratio=52/48); 0.6 g of naphthylimide triflate; and propylene glycol methyl ether acetate (PGMEA) used as a solvent was prepared, and the PGMEA used as a solvent was further added to the carbon black dispersion to prepare a resist (II) in which carbon having a solid content of 14% was diffused.

Preparation Example 3

Fifty grams of a titanium dioxide diffusion (titanium dioxide particle size of about 20 nm and content of 20 wt %)

containing: 10 g of a m,p-cresol novolak resin (weight-average molecular weight of 7,800); 3.0 g of hexamethoxymethyl melamine; 0.5 g of 2,4-bis(trichloromethyl)-6-phenyl-1,3,5-triazine; and propylene glycol methyl ether acetate (PGMEA) used as a solvent was prepared, and the PGMEA used as a solvent was further added to the titanium dioxide diffusion to prepare a resist (III) in which titanium dioxide having a solid content of 16% was diffused.

Preparation Example 4

Fifty grams of an aluminum oxide ($Al_2O_3$) dispersion (aluminum oxide particle size of about 30 nm and content of 20 wt %) containing: 10 g of a m,p-cresol novolak resin (weight-average molecular weight of about 4,800), 1.4 g of poly(methylpentene-sulfone) (weight-average molecular weight of 43,500); and isoamyl acetate used as a solvent was prepared, and the isoamyl acetate used as a solvent was further added to the aluminum oxide dispersion to prepare a resist (IV) in which aluminum oxide having a solid content of 16% was diffused.

Preparation Example 5

Thirty grams of a carbon black dispersion (carbon black particle size of about 20 nm and content of 20 wt %) containing: 6.0 g of poly(methylmethacrylate-co-acrylic acid-co-hydroxyethylacrylate) (molar ratio=70:20:10); 4.0 g of pentaerythritol triacrylate; 0.2 g of t-butylanthraquinone; 0.01 g of ethylviolet; 0.10 g of p-methoxyphenol; 0.10 g of 2,2,6,6-tetramethyl-1-piperidinyloxy; and propylene glycol methyl ether acetate (PGMEA) used as a solvent was prepared, and the PGMEA used as a solvent was further added to the carbon black dispersion to prepare a resist (V) in which carbon having a solid content of 16% was diffused.
(Embodiment 1)

Figure 2:
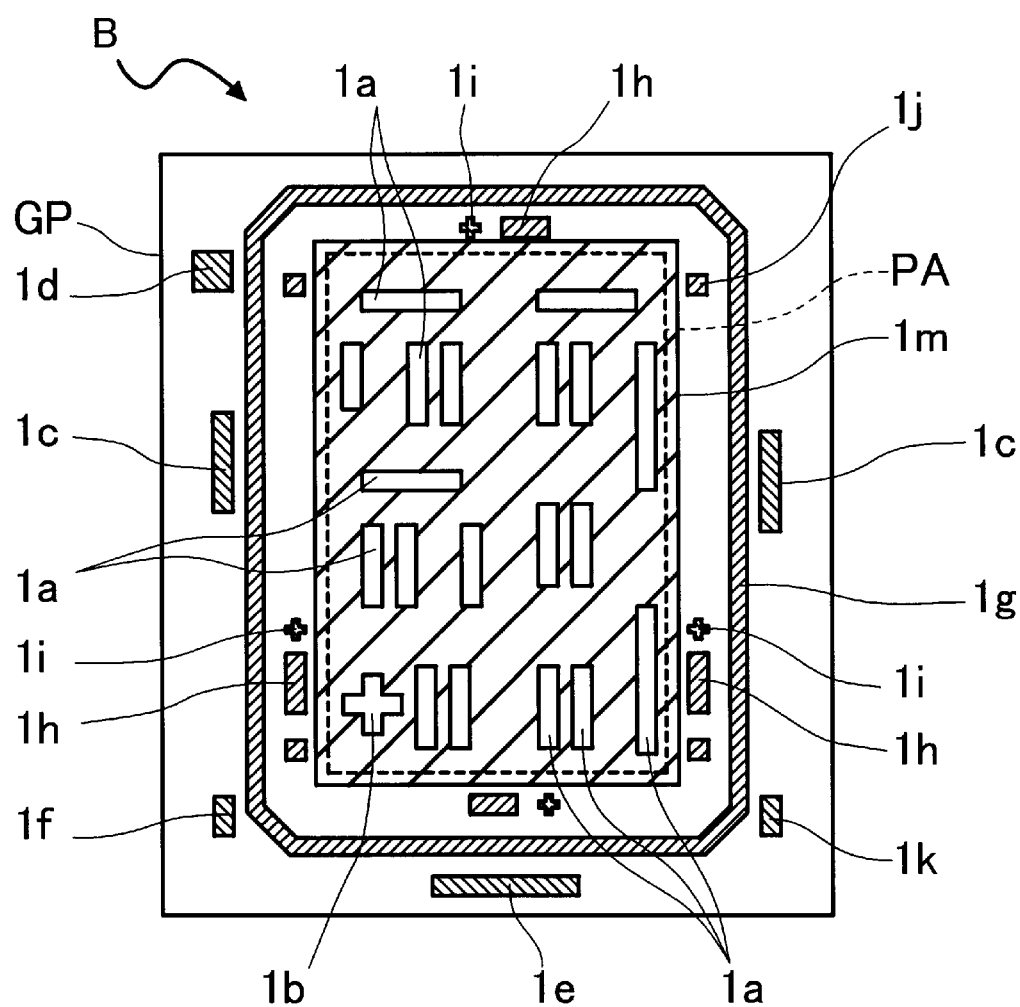
FIG. 2 is a plan view of a photo mask used in the steps of manufacturing a semiconductor device according to another embodiment of the present invention.

A mask configuration will be described first with reference to FIGS. 1 and 2 which are top views of masks. FIG. 1 shows a so-called mask A having a black pattern surface, i.e., a photo attenuative material, FIG. 2 shows a mask B having a white pattern surface, i.e., a transparent surface, in other words, a glass surface.

Reference symbol GP denotes a glass plate (transparent plate), and reference symbol PA denotes a circuit pattern area. Reference numeral $1a$ denotes a circuit pattern; $1b$, a wafer alignment mark transferred onto a semiconductor wafer (to be referred to as a wafer hereinafter) to serve as an alignment reference on the wafer in the next and subsequent steps; $1c$, a reticle alignment mark which transmits the correct position of a mask to an aligner; $1d$, a bar code (mark for discrimination) which is used for mask management; $1e$, a discrimination mark (mark for discrimination) which is used for mask discrimination; $1f$, a base line adjustment pattern which corrects aging of focusing and position alignment; $1g$, a pellicle frame; $1h$, a critical dimension monitor pattern; $1i$, a pattern displacement monitor pattern; and $1j$ denotes a phase angle monitor mark of a half-tone phase shift mask. In the Embodiment 1, since a binary mask will be described, the phase angle monitor mark $1j$ of these components is not mentioned in the Embodiment 1. In the Embodiment 2, in which a half-tone mask phase shift mask will be described, the phase angle monitor mark $1j$ is mentioned. Of these components in FIG. 1, the circuit pattern $1a$, the wafer alignment mark $1b$, the reticle alignment mark $1c$, the bar code $1d$, the discrimination mark $1e$, the base line adjustment pattern $1k$, the critical dimension monitor pattern $1h$, the pattern displacement monitor pattern $1i$, and the phase angle monitor mark $1j$ are constituted of the later-described photo sensitive and photo attenuative material. In FIG. 2, the bar code $1d$ and the wafer alignment mark $1b$ function as window portions to form a pattern having an exposed glass surface. A field area $1m$ is constituted of a photo sensitive and photo attenuative material.

An example of a method of manufacturing a mask according to this embodiment will be described below with reference to FIG. 3.

Figure 3A:
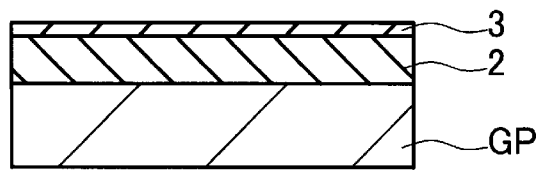
FIG. 3A is a sectional view showing a main part of a photo mask used in the steps of a semiconductor device manufacturing method according to the embodiment of the present invention.
Figure 3B:
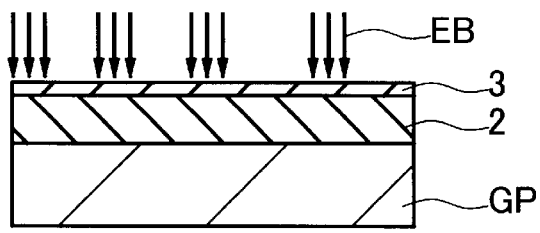
FIG. 3B is another sectional view showing a main part of the photo mask used in the steps of a semiconductor device manufacturing method.

As shown in FIG. 3A, as a photo sensitive and photo attenuative material, a resist film 2 used to form a resist pattern and containing at least a fine particle material and a binder was coated on the transparent glass plate (blanks) GP made of, e.g., quartz or the like. Specifically, the resist (I) containing diffused carbon and prepared in line with the Preparation example 1 was spin-coated and baked at, e.g., 100° C. for 2 minutes to obtain a coating film having a film thickness of 520 nm. In this case, molten quartz glass is used as the material of the glass plate GP. However, an optical glass such as LE (LOW EXPANSION) glass or transparent crystal such as calcium fluoride can also be used. Note that the molten quartz glass has such a merit that the molten quartz glass is transparent up to an ArF excimer laser region (wavelength of 193 nm) and has a small thermal expansion coefficient. The molten quartz is excellent in this sense. Thereafter, as shown in FIG. 3B, a water soluble conductive layer 3 was coated on the resultant structure, and a desired pattern was exposed by an electron beam EB obtained by an electron beam aligner (HL-800D by Hitachi, Ltd.) having an acceleration voltage of 50 kV.

Figure 4:
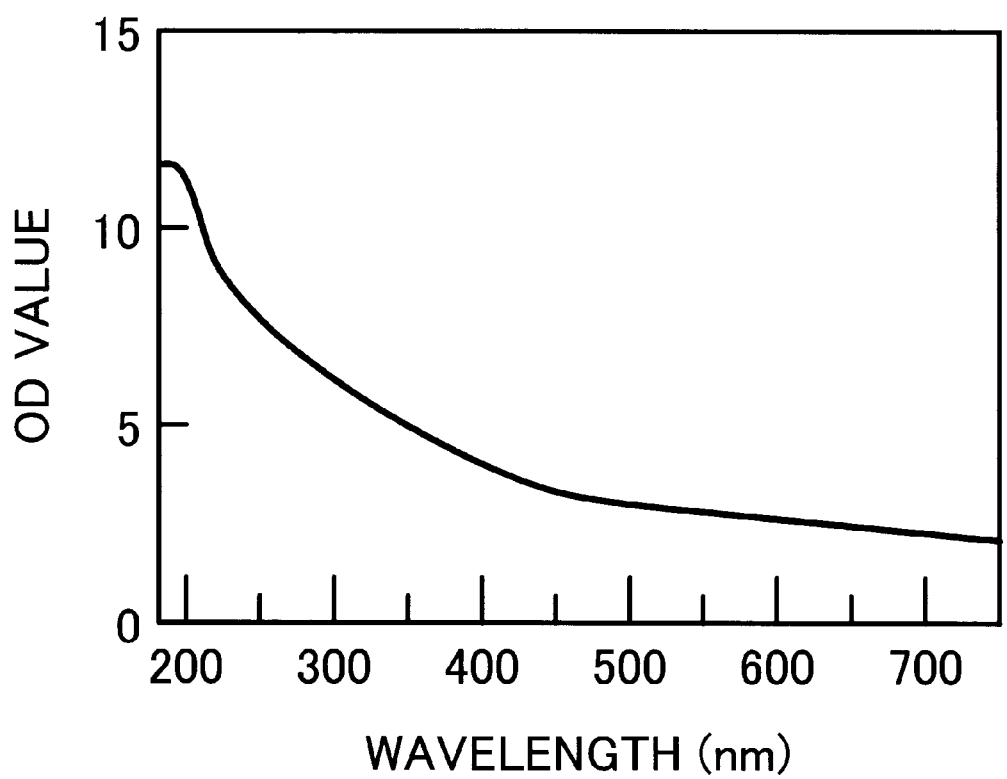
FIG. 4 is a graph showing spectroscopic characteristics of a resist (I), in which carbon is diffused, according to the embodiment of the present invention.

In the resist (I) containing diffused carbon, which is used here, light is scattered due to carbon particles diffused in the resist film, thereby preventing the light from transmitting. An OD value of the resist (I) containing diffused carbon and having a film thickness of 1.0 μm measured by a spectrophotometer is shown in FIG. 4. In the resist (I) containing diffused carbon according to this embodiment, transmission of light was suppressed due to the diffused carbon fine particles serving as scattering particles. When a film thickness was 1.0 μm, the OD value with respect to an ArF excimer laser beam having the wavelength of 193 nm was 11.6, the OD value with respect to a KrF excimer laser beam having a wavelength of 248 nm was 8.0, and the OD value with respect to an i-ray having the exposure wavelength of 365 nm was 5.0. The fine particle material contained in the shield pattern scatters irradiated optical energy. A part of the optical energy is absorbed. However, since most of the optical energy was scattered, accumulation of the energy in the shield pattern portion was small, and degradation did not easily occur.

The gain size of the fine particle material (carbon) was desirably 200 nm or less, more desirably, 100 nm or less. Further, 50 nm or less was the most preferable. It is not impossible to use the fine particle material having a particle size exceeding 200 nm. However, when the particle size is excessively large, the roughness on the sidewall of the pattern formed as the mask is increased. For this reason, it becomes difficult for a mask to obtain a sufficient precision. In addition, when the particle size is excessively large, the fine particle material cannot scatter the light properly (uniformly) in the shield pattern. The particle sizes of the fine particle material contained in the shield pattern are hard to be uniformed, and thus the fine particles having various particle sizes are contained therein. The particle size of 200 nm mentioned here is the maximum size, and the particle sizes about 200 nm are distributed. The fine particle material having particle size equal or almost equal to each other may be diffused in the shield pattern. However, when both of a fine particle material having a relatively large particle size and a fine particle material having a relatively small particle size are contained, the fine particle material having the relatively small particle size can be distributed between the fine particle materials having the relatively large particle sizes. Specifically, gaps between the large fine particle materials can be buried with the small fine particle material. In this manner, the transmittance of the exposure light can be changed. In addition, the transmittance of the exposure light can be decreased in comparison to a case in which only the large fine particle material is contained in the shield pattern. The particle size mentioned here is a particle size of one particle when the fine particle material is measured. The particle size indicates a particle size of one fine particle material in some cases, or indicates a particle size of an aggregate of a plurality of fine particles in other cases.

Figure 3C:
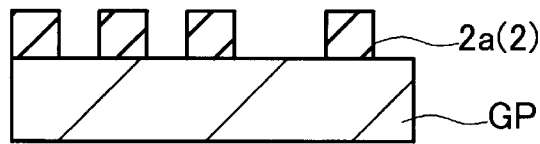
FIG. 3C is another sectional view showing a main part of the photo mask used in the steps of a semiconductor device manufacturing method.

After the electron beam exposure, as shown in FIG. 3C, development was performed using a 2.38-wt % tetramethyl ammonium hydroxide (TMAH) solution containing 0.3-wt % sodium dodecyl sulphate as a surface-active agent to form a photo attenuative pattern 2a containing at least carbon. The above antistatic film is an aqueous soluble, and is removed simultaneously with the development of the resist pattern. The resist (I) containing diffused carbon is a negative resist. A desired pattern having a residual film thickness of 500 nm and a minimum dimension of 0.8 $\mu$m could be formed at an amount of exposure of 20 $\mu C/CM^2$. Therefore, a mask having the photo attenuative pattern 2a (photo sensitive and photo attenuative material) containing fine particles of carbon black and having a desired shape could be manufactured. In this embodiment, in manufacturing a mask, the steps of depositing and etching a metal film made of chromium or the like are not required. For this reason, since the steps of manufacturing a mask can be simplified, a time for manufacturing a mask can be considerably shortened. Since the step of etching a metal film can be omitted, deterioration of the pattern dimension accuracy due to the etching can be suppressed, and thus the precision of pattern dimensions on the mask can be improved. As a result, the transfer precision of a pattern transferred on to a wafer can be improved. In addition, since the steps of depositing and etching a metal film can be omitted, defects can be considerably reduced. Therefore, the yield and reliability of masks can be considerably improved.

When an OD value of the pattern area formed by the electron beam exposure was measured, the OD value was almost equal to the OD value shown in FIG. 4 in terms of a film thickness of 1.0 $\mu$m. Therefore, the OD value obtained at the film thickness of 500 nm with respect to a KrF excimer laser beam having the wavelength of 248 nm was 4.0 and was 0.01% in terms of a transmittance. For this reason, it was apparent that the mask was appropriate as a mask for KrF excimer laser exposure. When the mask was considered to be applied as a mask for an i-ray, the OD value at 500 nm was 2.5, and the transmittance was 0.32%. These values were some what large. Even though the film thickness is not changed, the mask cam be used for an i-ray. However, another photo mask having a film thickness of 600 nm was formed by increasing the film thickness of the resist (I) containing the diffused carbon. An OD value with respect to the wavelength of 365 nm at the film thickness of 600 nm was 3.0, and a transmittance was 0.10%. The transmittance for an ArF excimer laser beam having a wavelength of 193 nm of the resist (I) containing diffused carbon is smaller. For this reason, a photo mask having a film thickness of 300 nm was formed. An OD value in this case was 3.5, and a transmittance was 0.032%. With an increase in wavelength, the OD value decreased. However, even though the film thickness was 300 nm, the OD value was 2.5 at a wavelength of 750 nm and was 18% in terms of a transmittance.

Masks for KrF excimer laser exposure having photo photo attenuative areas of different transmittances were manufactured and examined. As a result, the masks having a transmittance of 1% or less with respect to a wavelength of 248 nm functioned as binary masks. In addition, the inventors of this invention found out for the first time that a mask having a transmittance of 0.5% or less could assure linearity of an isolated pattern and was more preferable. Furthermore, the inventors of this invention also found out for the first time that a mask having a transmittance of 0.1% or less could assure the linearity of dense patterns and was more preferable.

After the development, a thermal process was performed to the resist used as a mask in order to improve the resistance to exposure light. In this case, the thermal process temperature was set to be, e.g., 120° C. This temperature is only an example and is changed depending on the materials of the resist. The process is preferably performed at a temperature as high as possible within the range in which the resist pattern is not transformed. In this thermal process, a film thickness and a transmittance rarely were changed.

The mask according to this embodiment could be manufactured by coating, exposure, and development of an organic film. Since the sputtering step using a vacuum device as in deposition of a chromium film and the step of etching the chromium film were omitted, and the manufacturing yield of masks was high. After the used of the mask, when carbon black is used as a fine particle material as in this embodiment, the mask can completely reproduced to the state of blanks by ashing or solvent treatment. Therefore, the mask is also effective to recycling of resources.

The content of the fine particle material in a shield pattern area containing at least a fine particle material (carbon or the like) and a binder was preferably 10% or more and 99% or less. When the content was 10% or less, a transmittance was high on a long wavelength side, and a problem occurred in alignment monitoring or the like. In order to form a shield pattern, a fine particle material and a binder are generally combined to each other, which means that the binder occupies a certain amount of the content thereof. However, after a pattern is formed, heat energy is given to the pattern by a baking process to reduce a binder area, thereby the content of the fine particle material can be increased. Although the carbon is mentioned as the fine particle material, when a shield pattern containing fine particles of carbon or graphite is used, the shield pattern can be removed by ashing. Therefore, an advantage that a quartz or glass plate can be reproduced from a completed mask by the step of ashing can be achieved.

Figure 5:
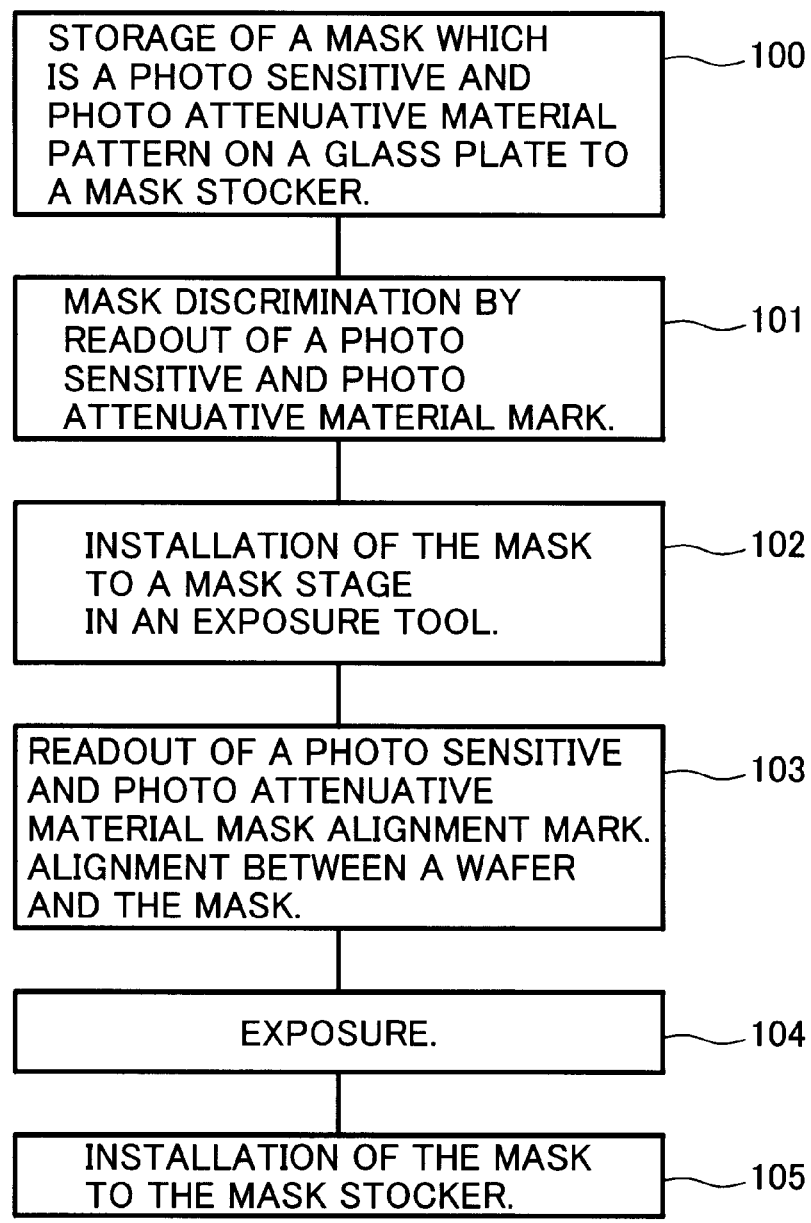
FIG. 5 is a flow chart of photolithography steps in the steps of manufacturing a semiconductor device according to the embodiment of the present invention.
Figure 6:
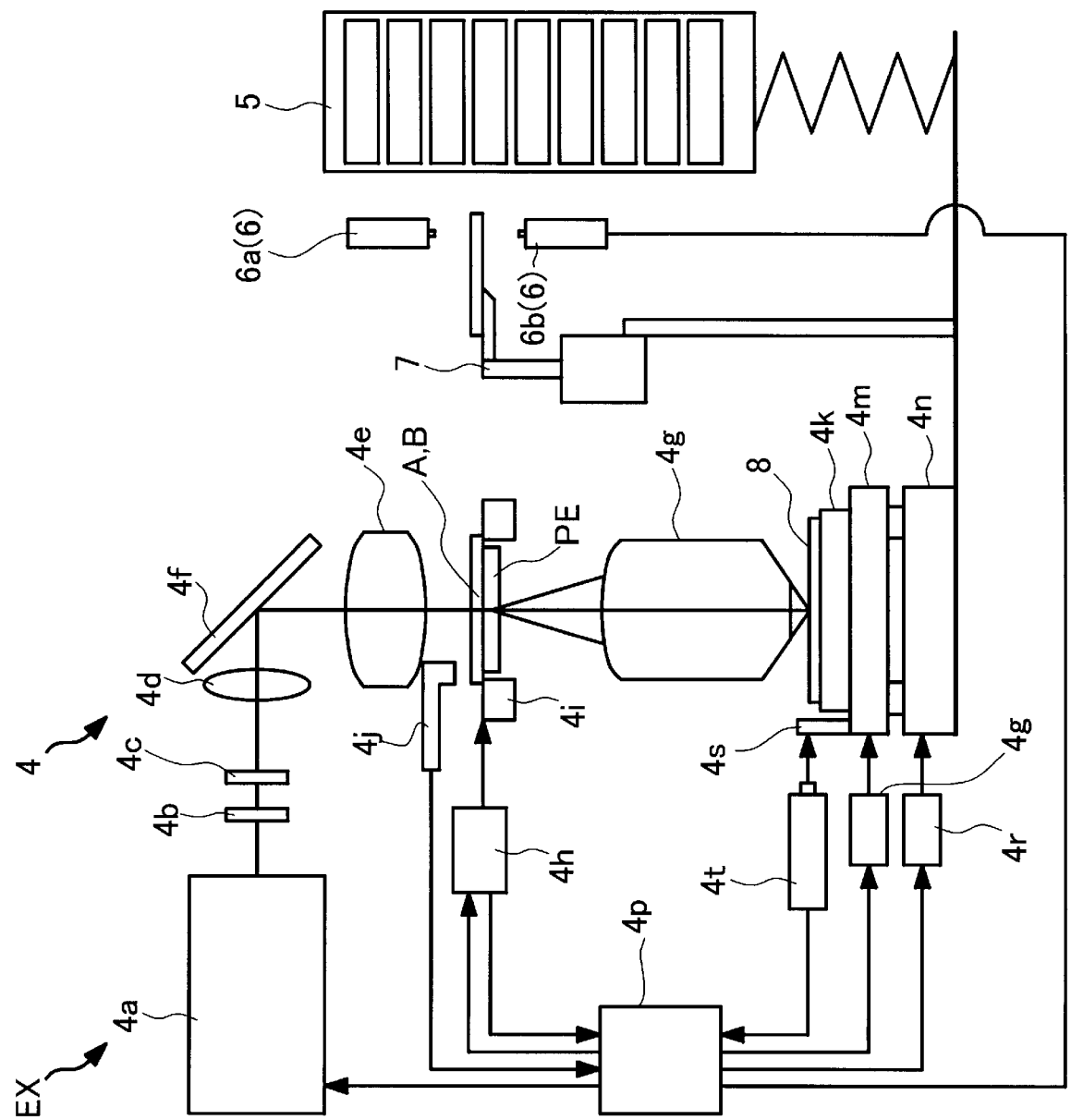
FIG. 6 is a diagram for explaining the configuration of an aligner used in the steps of manufacturing a semiconductor device according to the embodiment of the present invention.

An example of a semiconductor device manufacturing method using this mask will be described below. FIG. 5 shows the flow of steps, and FIG. 6 shows an example of an exposure tool EX used in the lithography step. The steps will be first described with reference to FIG. 5.

The masks (a plurality of masks corresponding to the steps required for a semiconductor device to be manufactured) are stored in a mask stocker (to be referred to as a stocker hereinafter) with reference to the wafer discrimination codes (discrimination marks 1e in FIGS. 1 and 2) so as to correspond to slot numbers of the mask stocker. In this case, the storage and management may also be performed in such a manner that bar codes (bar codes 1d in FIGS. 1 and 2) are optically read by a machine (step 100).

A mask corresponding to the type of the semiconductor to be manufactured, a step, or the like are picked out from a corresponding slot, and a wafer discrimination code, a bar code, or the like is read to check the mask. Therefore, in this embodiment, mask management can be easily performed. In this check operation, exposure information such as a masking blade position, exposure amount compensation by the exposure history of the mask, focus level compensation exposure, lens heating compensation by the occupancy of the transparent portion, alignment position offset compensation, and an exposure shot map which are written in the bar code 1d or the discrimination mark 1e can be read, and by using the read information in the next and subsequent steps, operational efficiency is improved (step 101).

Thereafter, the mask is installed to a mask stage of the aligner (step 102), and a mask alignment mark (reticle alignment marks 1c in FIGS. 1 and 2) is detected to calculate a correct position on which the mask is placed. Then, the mask and the wafer are aligned to each other with reference to the position of the wafer. Specifically, in this embodiment, the position of the mask can be easily detected by the reticle alignment mark 1c prior to an exposure process (step 103). There after, exposure is performed on the basis of the exposure information (step 104), and the mask is returned to the corresponding stocker (step 105).

The point of the above steps will be described below with reference to FIG. 6. The exposure tool EX has a reduction projection aligner 4, a photo mask stocker 5, a mask monitor 6, and a mask installation system 7 as main components. Exposure light emitted from a light source 4a of the reduction projection aligner 4 is irradiated on the mask A or the mask B (to be referred to a mask A, B hereinafter) through a fly eye lens 4b, an illumination pattern control aperture 4c, condenser lenses 4d and 4e, and a mirror 4f. The mask A, B is set such that major surfaces (first major surfaces), on which photo attenuative patterns are formed, face downward (on a wafer 8 side). Therefore, the exposure light is irradiated on the rear surfaces (second major surfaces) of the mask A, B. In this manner, the mask patterns written on the mask A, B are projected on a wafer 8 serving as a sample substrate through the projection lens 4g. A pellicle PE for preventing a pattern transfer failure due to the adhesion of the defects may be formed on the first major surface of the mask A, B. The mask A, B is vacuum-sucked on the mask stage 4i controlled by the mask position controller 4h and it is aligned by the position monitor tool 4j and thereby alignment between its center and the optical axis of the projection lens is made accurately. The wafer 8 is vacuum-sucked on the sample stage 4k. The sample stage 4k is placed on a Z stage 4m which can move in the direction of the optical axis of the projection lens 4g, i.e., the direction of the Z axis, and then mounted on an X-Y stage 4n. Since the Z stage 4m and the X-Y stage 4n are driven by drive units 4q and 4r according to control instructions from a main control system 4p, respectively, the Z stage 4m and the X-Y stage 4n can move to a desired exposure position. The position is accurately monitored by a laser measuring system 4t as the position of the mirror 4s fixed to the Z stage 4m. In addition, as position monitor tool 4j, for example, a diode lamp or a halogen lamp (wavelength of 400 to 750 nm) is used.

A plurality of masks required to manufacture a semiconductor device are stored in the stocker 5 having an elevation mechanism. The elevation mechanism is not necessarily provided in the stocker 5. The elevation mechanism may be provided in the mask installation system 7. The mask A, B which is appropriate for a type or a step is picked out from the stocker 5 by the mask installation system 7, the discrimination mark 1e or the bar code 1d (see FIGS. 1 and 2) of the mask is illuminated by an illumination system 6a of the mask monitor 6 to read the information of the discrimination mark 1e or the bar code 1d using the light-receiving system 6b. As the illumination system 6a, a white lamp (wavelength of 400 to 600 nm) is used. A diode lamp, a semiconductor laser (wavelength of 450 to 750 nm), or the like may be used. Since the pattern itself to be read is not so small, expensive short-wavelength systems need not be used as the illumination system 6a, the light-receiving system 6b, and the like. In particular, since the discrimination mark 1e may be visually checked by an operator, the discrimination mark 1e is preferably read by visible light. The read information is sent to the main control system 4p to check whether the mask A, B is a desired mask or not, and is used as data of, e.g., a masking blade position, exposure amount compensation, alignment compensation, a exposure shot map, and lens heating compensation. Thereafter, the mask A, B is sent to the mask stage 4i.

According to the embodiment, management of masks to be applied could be easily and extremely efficiently performed. In addition, QC (QUALITY CONTROL) compensation such as exposure amount compensation could be easily and extremely efficiently performed. Specifically, masks each having a short TAT could be used in one series of the steps of manufacturing a semiconductor device at low cost. Therefore, a small number of semiconductor devices of many types can be developed in a short period of time and at low cost.

Furthermore, according to the embodiment, when waste masks are reproduced to be used again, the cost of the masks can be reduced, and are source-saving effect canal so be achieved. The procedure for the reproduction will be described below with reference to FIG. 7.

Storage of masks in a stocker, mask discrimination, exposure information readout, installation of masks to an aligner, mask alignment, exposure, and return of the mask to the stocker are the same as those in described above. When the masks are planed to be used again, the masks are stored and used in the above steps again. When the masks are waste masks which are not planned to be used again (step 106), the mask is picked out from the stocker 5, and a photo sensitive and photo attenuative material on the mask is removed by $O_2$ plasma ashing or the like (step 107). Then, cleaning such as ozone sulfuric acid cleaning or brush cleaning is performed, and it is confirmed that no defect exists on the glass plate GP. If it is confirmed, the glass plate is recycled as a glass plate of a mask (step 108). Mask manufacturing steps such as coating of a photo sensitive and photo attenuative material (step 109), exposure, and development (step 110) are performed. The mask thus manufactured is used as a new mask in a lithography step according to the steps subsequent to the storage in the stocker. In the mask according to the embodiment, since the bar code 1dthe discrimination mark 1e, and the like of the mask are constituted of the photo sensitive and photo attenuative material, when the mask is recycled, the discrimination mark and the bar code can be changed into a discrimination mark and a bar code for the reproduced mask. Therefore, management of reproduced masks can be easily and extremely efficiently performed. QC compensation such as exposure amount compensation can be easily and extremely efficiently performed.

(Embodiment 2)

In this embodiment, a case in which a half-tone phase shift mask is used will be described below.

In place of the resist (I) containing diffused carbon and used in the Embodiment 1, the resist (II) containing diffused carbon and prepared in line with the Preparation example 2 was used to form a photo attenuative pattern in the same manner as the Embodiment 1 on a glass plate. Since the resist (II) containing diffused carbon was a positive resist, in contrast to that an electron beam irradiated area was left after development in the steps of manufacturing a mask in FIG. 3, a non-irradiated area of the film is left, and an irradiated area was removed by development. As a configuration, a dark field mask in which the field area 1m shown in FIG. 2 was formed of a half-tone film was employed.

In the resist (II) containing diffused carbon, an OD value in the case of the wavelength of a KrF excimer laser beam and a film thickness of 1.0 μm was 7.0. This material was spin-coated and baked at, e.g., 110° C. for 2 minutes to obtain a coating film having a film thickness of 0.22 μm. Exposure was performed by an electron beam aligner having an acceleration voltage of 50 kV. Thereafter, baking was performed at, e.g., 130° C. for 2 minutes, and development was performed with the same developer as that in the Embodiment 1 for about 45 seconds to obtain a mask having a hole pattern having a size of 0.18 μm. A thermal process was performed at 150° C. while irradiating Deep Ultraviolet light (DUV light) to prevent the resist pattern from being transformed.

The film thickness of the pattern of the resist (II) containing diffused carbon on the mask subjected to the thermal process was, e.g., 0.19 μm, and the transmittance with the film thickness to a KrF excimer laser beam was 5%. The phase of light transmitted through the film with this film thickness was inverted into almost 180° C. (=π). For this reason, it was found out that the mask was suitable as a half-tone phase shift mask when the KrF excimer laser beam was used as an exposure light source. The phase inversion of light may be set to 3π, 5π, or others.

In addition, masks for KrF excimer laser exposure having shield areas having different transmittances were formed and examined, as a result, it was found out that a mask having a transmittance of 2% or more and 16% or less was effective as a half-tone mask. In addition, the inventors of this invention found out the following fact. That is, although a mask having a transmittance of about 9% to 16% or less was effective as a half-tone mask, a sub-peak was generated and an auxiliary pattern had to be arranged. The inventors of this invention also found out the fact that a sub-peak was generated but not conspicuous if using a mask having a transmittance of about 4% to 95%, and the sub-peak could be prevented by the layout of the mask. The inventors of this invention also found out the following fact. That is, although a mask having a transmission of 2% or more and 4% or less was slightly effective as a half-tone mask, no sub-peak was generated, and linearity could be assured.

Light having, e.g., wavelength of 750 nm was used to detect the reticle alignment mark 1c of the mask. However, mark detection could be performed when the transmittance of the mark to this light was 60% or less. In particular, when the transmittance was 30% or less, detection precision was high. When the wavelength of detection light of the reticle alignment mark 1c was shorter than 750 nm, the transmittance of the photo sensitive and photo attenuative material was more decreased. For this reason, a problem in pattern detection did not occur. The bar code 1d and the discrimination mark 1e of the mask could be similarly detected when the transmittance was 60% or less. In particular, even though the intensity of the light source was unstable when the transmittance was 30% or less, discrimination, recognition, and reading of the masks could be performed without any erroneous detection, and detection precision was high. On the short wavelength side, regulation was performed by the exposure light source of the aligner. When an ArF excimer laser beam was used, it was required that a transmittance to the light having the wavelength of 193 nm was not more than the above-described transmittance. When an $F_2$ excimer laser beam was used, it was required that a transmittance to the light having the wavelength of 157 nm was not more than the above-described transmittance.

(Embodiment 3)

In this embodiment, in place of the resist (I) containing diffused carbon and used in the Embodiment 1, the resist (III) prepared in line with the Preparation example 3 in which titanium dioxide was diffused was used. In the same manner as the Embodiment 1, a coating film was formed on a glass plate made of quartz or the like, exposure was performed by an electron beam aligner. After the exposure, baking and spray development were performed to form a negative photo attenuative pattern having, e.g., a film thickness of 0.60 μM and a minimum dimension of 1.0 μm.

In the case of an ArF excimer laser beam having a wavelength of 193 nm, an OD value of the photo attenuative area having a film thickness of 0.60 μm formed of the resist (III) containing diffused titanium dioxide was 4.8 (transmittance of 0.0016%), and in the case of a KrF excimer laser beam having a wavelength of 248 nm, the OD value was 3.9 (transmittance of 0.013%), and in the case of an i-ray having the exposure wavelength of 365 nm, the OD value was 2.4 (transmittance of 0.39%).

Also in this case, similar to the Embodiment 2, as shown in FIGS. 1 and 2, light having a wavelength of 750 nm was used to detect the reticle alignment mark 1c of the mask A, B. However, the mark could be detected when the transmittance of the mark to this light was 60% or less. In particular, when the transmittance was 30% or less, detection precision was high. When the wavelength of detection light of the reticle alignment mark 1c was shorter than 750 nm, the transmittance of the photo sensitive and photo attenuative material was more decreased. For this reason, a problem in pattern detection did not occur. The bar code 1d and the discrimination mark 1e of the mask could be similarly detected when the transmittance was 60% or less. In particular, even though the intensity of the light source was unstable when the transmittance was 30% or less, discrimination, recognition, and reading of the masks could be performed without any erroneous detection, and detection precision was high.

(Embodiment 4)

In this embodiment, in place of the resist (I) containing diffused carbon and used in the Embodiment 1, the resist (IV) prepared in line with the Preparation example 4 in which aluminum oxide was diffused was used. In the same manner as the Embodiment 1, a coating film was formed on a glass plate made of quartz or the like, exposure was performed by an electron beam aligner. After the exposure, baking and spray development were performed to form a positive photo attenuative pattern having, e.g., a film thickness of 0.70 μm and a minimum dimension of 1.2 μm.

In the case of an ArF excimer laser beam having the wavelength of 193 nm, an OD value of the pattern area having a film thickness of 0.70 μm formed of the resist (IV) containing diffused aluminum oxide was 4.7 (transmittance of 0.0020%), and in the case of a KrF excimer laser beam having the wavelength of 248 nm, the OD value was 3.6 (transmittance of 0.025%), and in the case of an i-ray having the exposure wavelength of 365 nm, the OD value was 2.2 (transmittance of 0.63%).

In this case, as shown in FIGS. 1 and 2, light having a wavelength of 660 nm was used to detect the reticle alignment mark 1c of the mask A, B, and the mark could be detected when the transmittance of the mark to this light was 60% or less. In particular, when the transmittance was 30% or less, detection precision was high. When the wavelength of detection light of the reticle alignment mark 1c was shorter than 660 nm, the transmittance of the photo sensitive and photo attenuative material was more decreased. For this reason, a problem in pattern detection did not occur. White light (e.g., wavelength of 400 to 600 nm) was used to detect the bar code 1d and the discrimination mark 1e, and these marks could be detected when the transmittance was 60% or less. In particular, even though the intensity of the light source was unstable when the transmittance was 30% or less, discrimination, recognition, and reading of the masks could be performed without any erroneous detection, and detection precision was high.

(Embodiment 5)

In this embodiment, In place of the resist (I) containing diffused carbon and used in the Embodiment 1, the resist (V) prepared in line with the Preparation example 5 and containing diffused carbon was used. In the same manner as the Embodiment 1, a material was spin-coated on a glass plate made of quartz and baked at, e.g., 90° C. for 1 minute to obtain a coating film having a film thickness of 700 nm. Light having a wavelength of 364 nm was irradiated at 50 mJ/cm$^2$ on the glass plate side by a laser writer (ALTA3500) to perform exposure. Thereafter, the coating film was developed for 120 seconds with 0.2% tetramethyl ammonium hydroxide containing 0.05% of polyoxyethylene as a surface active agent to obtain a negative pattern. As a result, a mask including a pattern having a residual film thickness of 500 nm and a minimum dimension of 2 μm was obtained. At this time, an OD value of the resist pattern area in the case of an i-ray (wavelength of 365 nm) was 2.4, and a transmittance was 0.4%.

The mask was also subjected to lithography including the mask storage step, the mask discrimination step, the alignment step, and the exposure step performed in the above embodiments. As a result, the lithography could be efficiently performed.

(Embodiment 6)

In this embodiment, a photo sensitive and photo attenuative material obtained by containing a fine particle material such as carbon in a binder is not used, and a case in which the one obtained by adding a light-absorbing agent to a general resist is used is exemplified. Therefore, the Embodiment 6 is equal to the Embodiment 1 except the photo sensitive and photo attenuative material, and thus the procedure of lithography and the like shown in FIG. 5 including the procedure of recycling are equal to those in the Embodiment 1.

To a chemically amplified electron beam resist serving as a photo sensitive and photo attenuative material and containing a novolak resin as a base resin, 10 wt % of dicinnamal acetone, 10 wt % of 1,8-dimethoxy-9,10-bis (phenylethynyl) anthracene, and 10 wt % of chlorophyll A were added. This addition made it possible to obtain the 60% or less transmittance of the photo sensitive and photo attenuative material having a film thickness of 1 μm to the light having the wavelength ranging from 350 nm to 750 nm. In this manner, mask discrimination and alignment mark detection could be performed. In addition, when anthracene methanol was added, it was possible to obtain the 1% or less transmittance to the light having the wavelength of 248 nm, and thus a mask for a KrF excimer laser beam could be also obtained.

(Embodiment 7)

FIGS. 8A to 8G show an example of a method of manufacturing a phase shift mask used in a semiconductor device manufacturing method according to another embodiment of the present invention.

Figure 8A:
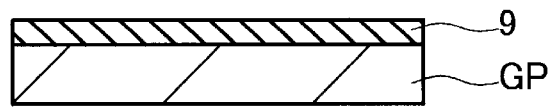
FIG. 8A is a sectional view of a main part of a Levenson-type phase shift mask used in the steps of manufacturing a semiconductor device according to the embodiment of the present invention.

As shown in FIG. 8A, a shifter film 9 was deposited on a glass plate (blanks) GP made of quartz or the like. It was assumed that the film thickness of the shifter film 9 was represented by d, the wavelength of exposure light was represented by λ, and a refractive index of the shifter film 9 to an exposure wavelength was represented by n. In this case, these values were set to satisfy $d=\lambda/2(n-1)$.

As the shifter film 9 mentioned here, a silicon oxide film ($SiO_x$) formed by, e.g., a sputtering method is used. However, the shifter film 9 is not limited to the silicon oxide film. Another film which transmits exposure light and has a uniform film thickness and a uniform refractive index can be used. In particular, a film such as an $SnO_x$ film or a $TiO_x$ film having a large refractive index can be decreased in film thickness (=d), and is preferably used because a photo attenuative pattern can be easily formed in the later step. When the refractive index is 1.6 ore more, the effect of the film thickness has appeared. Also, when an electrically conductive film is used, the film is not adversely affected by charge up in resist electron beam (EB) exposure to be described below. For this reason, a conductive film is preferably used as the shifter film 9. As a material of a conductive film, ITO (Indium-Tin-Oxide) or the like is known.

In order to improve the resistance, a heating process is performed after the shifter film 9 is coated. The setting of the film thickness (=d) is a film thickness after the thermal process. As the thermal process mentioned here, baking is performed at 200° C. for 30 minutes. However, the thermal process is not limited to the baking. Since the film thickness is an important factor to determine a phase angle, the film thickness is measured after the formation of the film including the thermal process. When the film thickness is not smaller than a reference value, the film is removed and formed again. An allowance of a variation in the film thickness of the film is dependent on dimensions and necessary dimension precision. However, in general, the allowance is about 1%. Since a shifter layer is coated on a flat surface, a uniform film thickness can be easily achieved, and a problem that a phase angle (film thickness) changes depending on dimensions obtained by a loading effect in an etching operation does not occur. For this reason, a high resolution and a high dimensional precision can be easily achieved. As the shifter film forming method mentioned here, a sputtering method is used. However, CVD (CHEMICAL VAPOR DEPOSITION) or a coating film forming method can also be used. In particular, the coating forming method has such a merit that the uniformity of a film is good. In this case, a film can be formed with a uniformity of 0.2%. This film has a high precision which corresponds to about 0.1° in terms of a phase angle offset. A film defect (pinhole defect or particle defect) of the phase shifter film is inspected. When the defect is detected, the shifter film 9 is reproduced and formed again. Since a countermeasure against a defect which causes a phase defect can be taken in the initial stage, management of the steps can be easily performed.

Figure 8B:
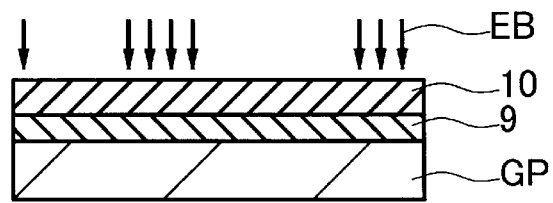
FIG. 8B is another sectional view of a main part of a Levenson-type phase shift mask used in the steps of manufacturing a semiconductor device.

As shown in FIG. 8B, an electron beam resist 10 is coated on the shifter film 9, and a desired shifter exposure pattern is exposed. When the shifter film 9 is not an electrically conductive film, a water soluble conductive layer is formed on the electron beam resist 10 to cope with the charge up during EB exposure. If no measure is taken, the position of the exposure pattern is offset due to the charge up. In this embodiment, since the water soluble conductive layer was formed in advance, the offset of the exposure position caused by the charge up did not occur. When the inventors of this invention examined a conductivity required to prevent the charge up, it was found out that a sufficient effect could be obtained by suppressing a sheet resistance to 50 MΩ/cm² or less.

Figure 8C:
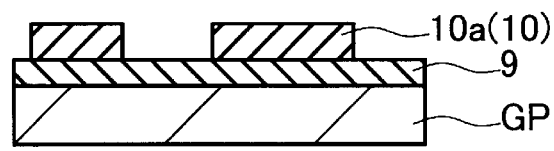
FIG. 8C is another sectional view of a main part of a Levenson-type phase shift mask used in the steps of manufacturing a semiconductor device.
Figure 8D:
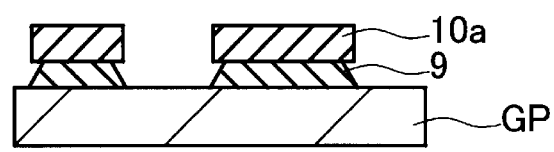
FIG. 8D is another sectional view of a main part of a Levenson-type phase shift mask used in the steps of manufacturing a semiconductor device.
Figure 8E:
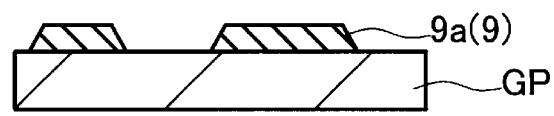
FIG. 8E is another sectional view of a main part of a Levenson-type phase shift mask used in the steps of manufacturing a semiconductor device.

As shown in FIG. 8C, development was performed to form a resist pattern 10a. Thereafter, as shown in FIG. 8D, the shifter film 9 was processed by etching by using the resist pattern 10a as a mask. As shown in FIG. 8E, the resist was removed to form a shifter pattern 9a on a glass plate GP. In this case, the sidewalls of the shifter pattern 9a were tapered. The taper angle was set to be, e.g., about 60° C. Then, defects such as phase shifter breaking defect and a phase shifter remaining defect were inspected by an edge detection method. Since the shield material was not formed around the shifter pattern 9a, a shifter defect could be inspected by an edge detection method. For this reason, a simple phase detect inspection having a high detection precision could be performed.

Figure 8F:
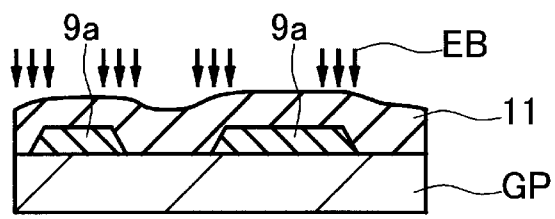
FIG. 8F is another sectional view of a main part of a Levenson-type phase shift mask used in the steps of manufacturing a semiconductor device.

Thereafter, as shown in FIG. 8F, a resist film 11 made of the resist (I) containing diffused carbon and prepared in line with the Preparation example 1 was coated to have a film thickness of, e.g., 420 nm, and EB exposure was performed to form a desired shape. It was effective to form an electrically conductive film for preventing the charge up during this exposure like the exposure of the shifter pattern 9a. In this embodiment, an electrically conductive film having a sheet resistance of 30 MΩ/cm² was coated on the resist film 11 (not shown).

Since the edges of the shifter pattern 9a are tapered, the resist film 11 is well-coated, and a variation in film thickness is relatively small. For this reason, the dimensional precision of the photo attenuative pattern constituted of the resist film 11 was high. Although no pattern directly crosses a step, the influence of a variation in thickness of the resist film 11 spreads in wide area. Therefore, the effect of this tapering process is large. In this case, the taper angle is set to be 60° C. However, when the taper angle is smaller than 60° C. to moderate the taper angle, the variation in film thickness decreases further. On the other hand, since the photo attenuative pattern constituted of the resist film 11 must be formed with an alignment margin to cover the tapered portion, the minimum width of the photo attenuative pattern is limited. The optimum taper angle is determined by a pattern minimum rule, a shifter, and correspondence of the alignment precision of the photo attenuative pattern.

Figure 8G:
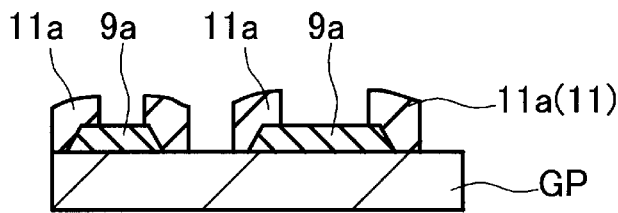
FIG. 8G is another sectional view of a main part of a Levenson-type phase shift mask used in the steps of manufacturing a semiconductor device.

Thereafter, as shown in FIG. 8G, development was performed to form a resist pattern 11a (i.e., a photo attenuative pattern) constituted of the resist (I) containing diffused carbon. In addition, one or both of a heating process and a DUV irradiation process were performed. These processes thus performed made it possible to improve a resistance of the photo attenuative pattern (resist pattern 11a) to the irradiation of exposure light.

An OD value of the resist pattern 11a of the resist (I) having a residual film thickness of 400 nm formed as described above and containing diffused carbon was measured. In the case of a KrF excimer laser beam having a wavelength of 248 nm, the OD value was 3.2, and was 0.063% in terms of transmittance. In the case of an ArF excimer laser beam having a wavelength of 193 nm, the OD value was 4.0, and was 0.01% in terms of transmittance. Therefore, it was apparent that the resist pattern 11a of the resist (I) formed as described above and containing diffused carbon was suitable for a shield area of a Levenson-type phase shift mask for KrF and ArF excimer laser exposure.

Similarly, when resists prepared in line with the Preparation examples 3 and 4 in which fine particle materials were diffused were used, Levenson-type phase shift masks could be formed.

The phase shift mask according to the embodiment had very high phase controllability, i.e., a phase error lower than 0.5°, and did not have dimensional dependency. For this reason, a dimensional precision and a resolution obtained when pattern transfer was performed were high. In addition, the photo attenuative pattern (resist pattern 11a) was in contact with blanks and a phase shifter with a large area, and a defect such as pattern peeling did not occur. Furthermore, since the number of steps of manufacturing a mask were relatively smaller in comparison to that of the general steps of manufacturing a mask using a metal as the photo attenuative material, a high yield and a short TAT could be achieved. The TAT could be reduced by half and the yield could be considerably increased, that is, from 30% in the general mask manufacturing method to 90%.

This Levenson-type phase shift mask was subjected to mask storage, mask discrimination, alignment mark detection, exposure, and installation to a stocker in the same method as that in the Embodiment 1 to manufacture a semiconductor device. As a result, a semiconductor device having a micro-circuit pattern could be manufactured at low cost and in a short manufacturing period of time. Therefore, the present invention can cope with the manufacture of small numbers of semiconductor devices of many types.

In this embodiment, although an $SiO_x$ film is used as a phase shifter, another photo sensitive transparent film can be used, or a phase difference can be obtained by digging a glass plate.

(Embodiment 8)

This embodiment is related to the manufacture of a semiconductor integrated circuit device having a twin-well CMIS (COMPLEMENTARY MIS) circuit, and will be described below with reference to FIG. 9.

FIG. 9 is a sectional view of a main part of a wafer 8 in the steps of manufacturing a semiconductor integrated circuit device. A semiconductor substrate 8S constituting the wafer 8 is made of, for example, an n-type a circular single crystal Si having a circular shape in plane. On the upper side of the semiconductor substrate 8S, for example, an n well NWL and a p well PWL are formed. The n well NWL is set to be n-type by doping phosphorous or As. The p well PWL is set to be p-type by doping, e.g., boron. The n well NWL and the p well PWL are formed in the following manner.

Figure 9A:
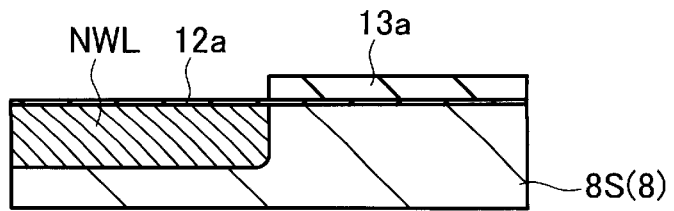
FIG. 9A is a sectional view of a main part of a semiconductor wafer in the steps of manufacturing a semiconductor device according to another embodiment of the present invention.

A wafer alignment mark for mask alignment is formed on the semiconductor substrate 8S (not shown). This wafer alignment mark can also be formed in the step of forming the wells by adding the selective oxidation step. Thereafter, as shown in FIG. 9A, an oxide film 12a made of silicon oxide or the like was formed on the semiconductor substrate 8S. Subsequently, a resist pattern 13a for an implantation mask was formed on the oxide film 12a by i-ray lithography. Thereafter, phosphorous for forming the n well NWL was ion-implanted in the semiconductor substrate 8S.

Figure 9B:
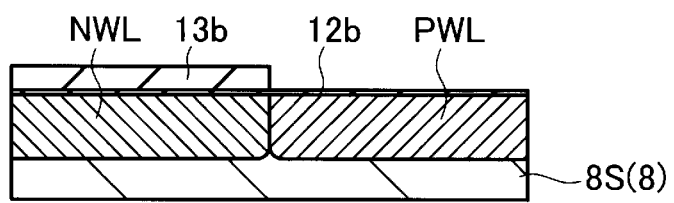
FIG. 9B is another sectional view of a main part of a semiconductor wafer in the steps of manufacturing a semiconductor device.

Thereafter, the resist pattern 13a was removed by ashing, and the oxide film 12a was removed. Thereafter, as shown in FIG. 9B, an oxide film 12b made of silicon oxide or the like was formed on the semiconductor substrate 8S. Subsequently, a resist pattern 13b for ion-implantation mask was formed on the oxide film 12b by i-ray lithography. Thereafter, boron for forming the p well was ion-implanted in the semiconductor substrate 8S.

Figure 9C:
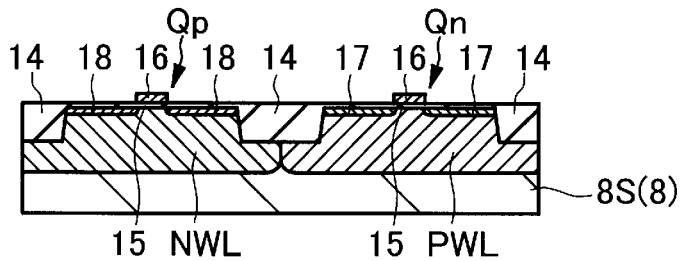
FIG. 9C is another sectional view of a main part of a semiconductor wafer in the steps of manufacturing a semiconductor device.

Thereafter, the resist pattern 13b and the oxide film 12b were removed. On a major surface (first major surface) of the semiconductor substrate 8S, as shown in FIG. 9C, a field insulating film 14 for isolation made of, e.g., a silicon oxide film was formed in the form of trench-shaped isolation.

As an isolation method, an LOCOS (LOCAL OXIDIZATION OF SILICON) method may be used. However, when the trench-shaped isolation is used, more micropatterning and a higher integration density can be achieved. In the lithography for forming the isolation, a reduction projection aligner using a KrF excimer laser beam as an exposure light source and a mask for a KrF excimer laser beam having a photo attenuative pattern according to the Embodiment 1 were used.

In an active area surrounded by the field insulating film 14, an nMIS Qn and a pMIS Qp are formed. Gate insulating films 15 of the nMIS Qn and the pMIS Qp is made of, e.g., silicon oxide films, and are formed by a thermal oxidation method or the like. Gate electrodes 16 of the nMIS Qn and the pMIS Qp are formed according to the following manner. That is, a gate forming film made of low-resistance polysilicon is deposited by a CVD method or the like. The film is subjected to lithography by using a reduction projection aligner having an ArF excimer laser beam as an exposure light source and a mask for an ArF excimer laser having a photo attenuative pattern made of a photo attenuative pattern described in the Embodiment 1. Thereafter, etching is performed. As the resist on the semiconductor substrate 8S, for example, an acrylic-resin-based chemically amplified resist was used.

The gate electrode 16 could be also formed by performing lithography using a reduction projection aligner having a KrF excimer laser beam as an exposure light source and a Levenson-type phase shift mask for a KrF excimer laser beam having a photo attenuative pattern described in the Embodiment 7. However, an exposure process using an ArF excimer laser beam is more preferable in relation to a dimensional precision. A phase shift mask described in the Embodiment 7 is preferably used because a dimensional precision can be more improved.

A semiconductor area 17 of the nMIS Qn is formed self-alignedly to the gate electrode 16 by doping, e.g., phosphorous or arsenic into the semiconductor substrate 8S by an ion-implantation method or the like with using the gate electrode 16 as a mask. Also, the semiconductor area 18 of the pMIS Qp is formed self-alignedly to the gate electrode 16 by doping, e.g., boron into a semiconductor substrate 3s by using the gate electrode 9 as a mask. However, the gate electrode 16 is not limited to a gate electrode formed of a single film made of, e.g., low-resistance polysilicon. Various gate electrodes can be used as the gate electrode 16. For example, the gate electrode 16 may have a so-called polycide structure in which a silicide layer made of tungsten silicide or cobalt silicide is formed on a low-resistance polycide layer. Alternatively, the gate electrode 16 may have a so-called poly-metal structure in which a metal film made of tungsten or the like is formed on a low-resistance polysilicon film via a barrier conductive film made of titanium nitride, tungsten nitride, or the like.

Figure 9D:
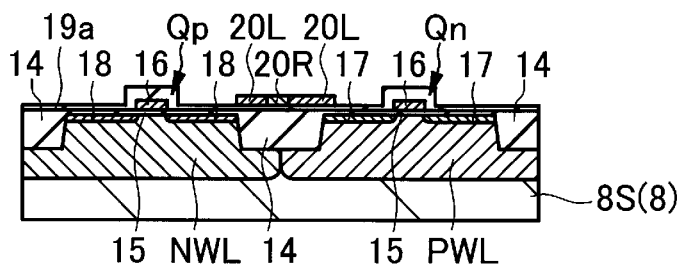
FIG. 9D is another sectional view of a main part of a semiconductor wafer in the steps of manufacturing a semiconductor device.

First, an interlayer insulating film 19a constituted of, e.g., a silicon oxide film is deposited on the semiconductor substrate 8S by a CVD method or the like as shown in FIG. 9D, and a polysilicon film is deposited on the upper surface of the interlayer insulating film 19a by a CVD method or the like. Subsequently, after lithography is performed on the polysilicon film, etching and patterning are performed, and then, an impurity is doped in a predetermined area of the patterned polysilicon film, thereby a wiring layer 20L and a resistor 20R made of the polysilicon films are formed.

Figure 9E:
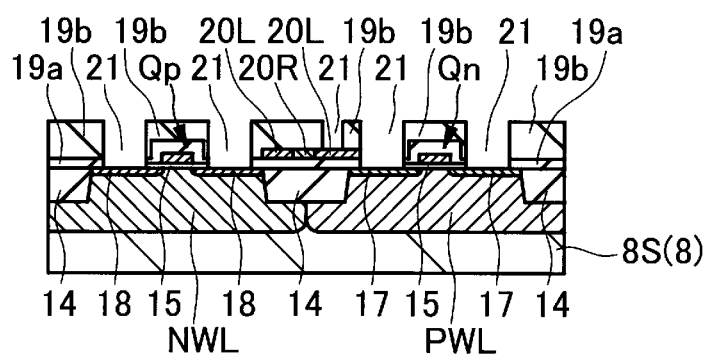
FIG. 9E is another sectional view of a main part of a semiconductor wafer in the steps of manufacturing a semiconductor device.

Thereafter, as shown in FIG. 9E, an interlayer insulating film 19b constituted of, e.g., a silicon oxide film is deposited on the semiconductor substrate 8S by a CVD method or the like. Thereafter, contact holes 21 which partially expose the semiconductor areas 17 and 18 and the wiring layer 20L are formed in the interlayer insulating films 19a and 19b by performing the lithography and the etching by using a reduction projection aligner having a KrF excimer laser beam as an exposure light source and a half-tone phase shift mask according to the Embodiment 2. As the resist on the wafer 8, a chemically amplified resist containing a phenol resin sensitive to a KrF excimer laser beam as a base resin was used.

Since the diameter of the contact hole 21 mentioned here is, e.g., 0.18 $\mu$M, KrF excimer laser exposure is used. However, when a diameter smaller than 0.15 $\mu$M is required, ArF excimer laser exposure may be used. This is because it is difficult that the KrF excimer laser exposure stably resolves a diameter smaller than 0.15 $\mu$M.

Figure 9F:
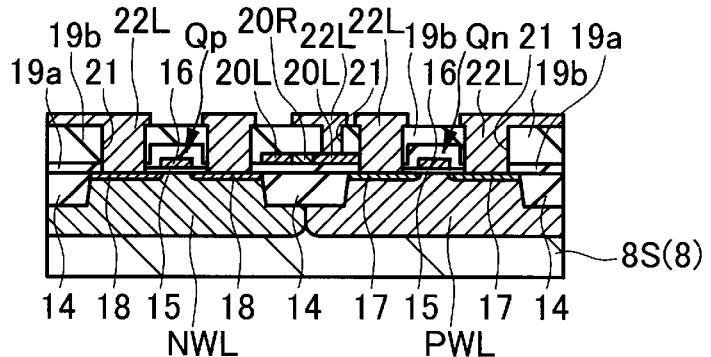
FIG. 9F is another sectional view of a main part of a semiconductor wafer in the steps of manufacturing a semiconductor device.

In addition, after metal films made of titanium (Ti), titanium nitride (TiN), and tungsten (W) are sequentially deposited on the semiconductor substrate 8S by a sputtering method and a CVD method, lithography is performed by using a reduction projection aligner having a KrF excimer laser beam as an exposure light source and a mask according to the Embodiment 1, and etching is performed, thereby a first wiring layer 22L is formed as shown in FIG. 9F.

As the resist on the semiconductor wafer 8, a chemically amplified resist containing a phenol resin sensitive to a KrF excimer laser beam as a base resin was used. In the following processes, like the first wiring layer 22L, the second wiring layer and the subsequent layers are formed to manufacture a semiconductor integrated circuit device. Since a wiring pitch mentioned here is, e.g., 0.36 $\mu$m, KrF excimer laser exposure is used. However, when a pattern having a wiring pitch smaller than 0.3 $\mu$M is used in relation to a resolution, ArF excimer laser exposure is used.

In a customized LSI (LARGE SCALE INTEGRATED CIRCUIT) product, mask debug is often performed to, especially, the first wiring layer. The rate of mask supply TAT to the first wiring layer determines the capability of developing products, and the required number of masks also increases. For these reasons, it is specially effective to apply the embodiment to this step. In addition, the minimum pattern dimension of the second wiring layer was sufficiently larger in comparison to, e.g., 0.35 $\mu$M (pattern pitch was 0.8 $\mu$M) and an exposure wavelength (0.248 $\mu$M). Therefore, a mask for a KrF excimer laser beam according to the Embodiment 1 was applied.

Figure 7:
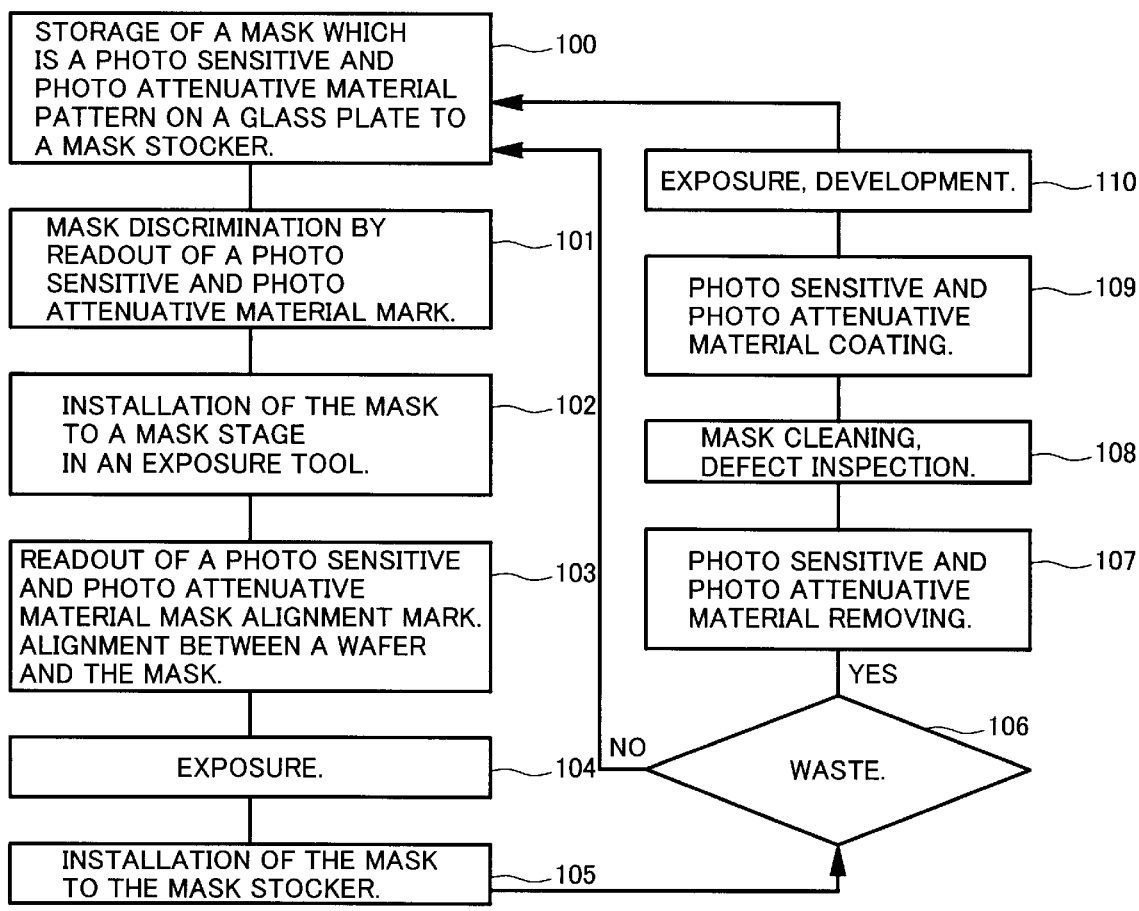
FIG. 7 is a flow chart of photolithography steps in the steps of manufacturing a semiconductor device according to the embodiment of the present invention.

In this embodiment, any one of the masks according to the Embodiments 1 to 7 was used in all the lithography steps, and lithography was performed in line with the procedure shown in FIG. 5 or FIG. 7 from mask storage, exposure, to the mask collection. As s result, in a semiconductor integrated circuit device having a CMIS circuit, a series of manufacturing processes to which an exposure history was reflected could be performed without a mistake in a mask to be used and any problem in alignment. Since the cost of manufacturing a mask was low and a manufacturing period was short, the cost of manufacturing a semiconductor integrated circuit device having a CMIS circuit could be reduced, and the semiconductor integrated circuit device could be manufactured for a short period of time. In addition, a development TAT of a semiconductor integrated circuit device having a CMIS circuit could be shortened.

(Embodiment 9)

In this embodiment, an example in which the present invention is applied to packaging will be described. In the embodiment, a case in which the technical idea of the present invention is applied to a so-called wafer process package (to be referred to as a WPP hereinafter) technique will be described. In the WPP technique, a package process is simultaneously performed to a plurality of semiconductor chips in the state of a wafer, which are formed on a wafer through, e.g., wafer processes. The wafer processes are also called pre-processes and include the following processes. That is, elements are formed on a major surface of a wafer subjected to mirror polishing, a wiring layer is formed, and a surface protection film is formed, thereby various electric tests for a plurality of semiconductor chips formed on the wafer can be performed using probes or the like.

Figure 10A:
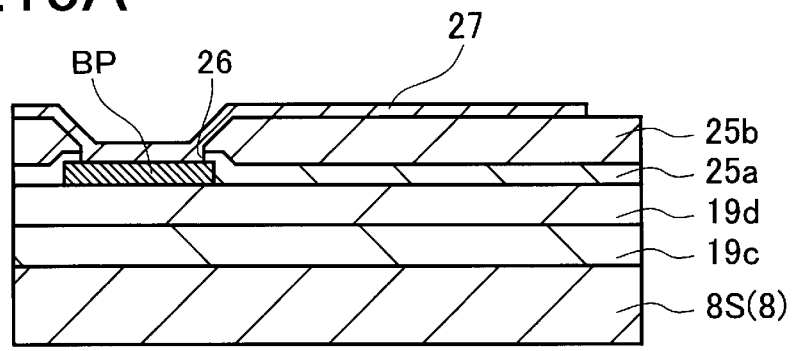
FIG. 10A is a sectional view of a main part of a semiconductor device in the steps of manufacturing the semiconductor device according to another embodiment of the present invention.
Figure 10B:
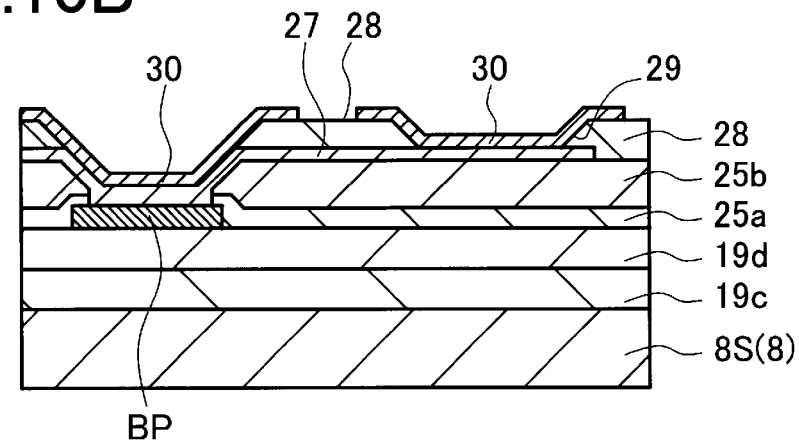
FIG. 10B is a sectional view of a main part of the semiconductor device in the steps of manufacturing the semiconductor device.
Figure 10C:
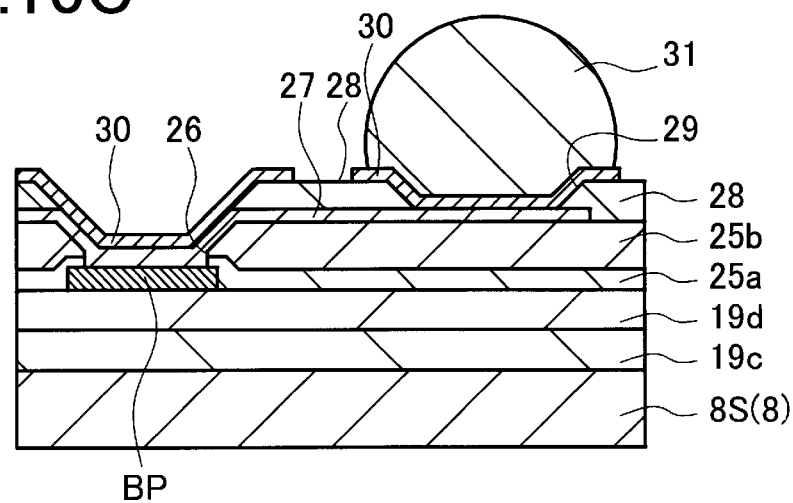
FIG. 10C is a sectional view of a main part of the semiconductor device in the steps of manufacturing the semiconductor device.

FIGS. 10A to 10C show sections of main parts of the semiconductor wafer 8 after forming a gate circuit portion and a multi-layered wiring is completed. The semiconductor chips mentioned here are simultaneously formed on the semiconductor wafer 8, and the wafer is not cut into semiconductor chip (to be referred to chips hereinafter) units.

As shown in FIG. 10A, on a major surface (first surface) of the semiconductor substrate 8S, for example, one or both of the logic element and a memory element and a multi-layered wiring are formed. A bonding pad BP is formed on the uppermost wiring layer of the multi-layered wiring. The bonding pad BP is formed in such a manner that the same material as that of a wiring layer such as aluminum or an aluminum alloy is patterned in the same process as the wiring layer. The surface of the bonding pad BP is covered with a surface protection film 25a except for some parts. The surface protection film 25a is constituted of, e.g., a silicon oxide film, a silicon nitride film, or a multi-layered film of these films. On the surface protection film 25a, for example, a surface protection film 25b made of a photo sensitive polyimide resin or the like and having a thickness of about 5 $\mu$m is deposited. An opening 26 is formed in the surface protection films 25a and 25b to expose a part of the bonding pad BP. When the opening 26 is formed, the masks described in the Embodiments 1 to 7 are preferably used. In this manner, even though the position or the like of the bonding pad BP changes depending on demands of products and customers, the masks can rapidly cope with the change of the bonding pad BP. Note that reference numerals 19c and 19d denote interlayer insulating films made of, e.g., silicon oxide films.

A relayout wiring 27 is formed on the surface protection film 25b. The relayout wiring 27 is formed in such a manner that a main wiring forming conductive film made of copper or the like is deposited on a barrier conductive film made of, e.g., chromium by a sputtering method, a vapor deposition method, or the like. The relayout wiring 27 is electrically connected to the bonding pad BP through the opening 26. However, the barrier film has a function of preventing diffusion of copper and a function of improving adhesive properties to a polyimide resin. The barrier film is not limited to a chromium film, and can be variably changed. For example, titanium, a tungsten titanium alloy, titanium nitride, or tungsten can also be used as the material of the barrier film. In the patterning of the relayout wiring 27, the lithography method described in the Embodiment 1 was used. The procedure of the lithography method was in line with the procedure shown in FIG. 5. However, since the line width of the relayout wiring 27 is larger than the width of a gate, an i-ray (wavelength of 0.365 $\mu$m) stepper (step-and-repeat reduction projection aligner) was used in the exposure for the patterning.

Subsequently, as shown in FIG. 10B, a molding resin film 28 made of a photo sensitive polyimide resin or the like is coated on the major surface of resulting structure on the semiconductor wafer 8 again to cover the relayout wiring 27. The uppermost molding resin film 28 is constituted of an organic insulating film such as a polyimide resin because a relatively soft organic insulating film is used as an uppermost layer to make it easy to handle chips. Specifically, when a chip having the uppermost insulating film made of an inorganic insulating film is handled (installation or the like), the molding resin film may be easily cracked, and the chip cannot be easily handled. However, when the organic insulating film is used, such a problem can be avoided because the film is relatively soft.

Thereafter, exposure and development processes are performed to the molding resin film 28 to form an opening 29 to partially expose the relayout wiring 27. In the exposure process for forming the opening 29, the lithography steps in the Embodiments 1 to 6 are preferably used. In this manner, even though the position or the like of the bonding pad BP and the relayout wiring 27 changes depending on demands of products and customers, the masks can rapidly cope with the change of the relayout wiring 27.

Thereafter, for example, chromium, a chromium-copper alloy or the like, and gold or the like are deposited in the order from below on the major surface of the resultant structure on the wafer 8 by a sputtering method or the like. The resultant layers are patterned by an etching process using a resist pattern as an etching mask to form a metal layer underneath a bump 30. In an exposure process for patterning the metal layer underneath a bump 30, the lithography steps in the Embodiments 1 to 6 are preferably used. In this manner, even though the position or the like of the bonding pad BP and the relayout wiring 27 changes depending on demands of products and customers, the masks can rapidly cope with the change of the relayout wiring 27. The metal layer underneath a bump 30 is formed to have, e.g., a circular shape in plane, and electrically connected to the relayout wiring 27 through the opening 29.

Finally, after a solder paste made of, e.g., a lead-tin alloy or the like is printed on the resultant structure, a thermal process is performed to the resultant structure on the semiconductor wafer 8 to form a solder bump electrode 31 on the metal layer underneath a bump 30 as shown in FIG. 10C.

Figure 11A:
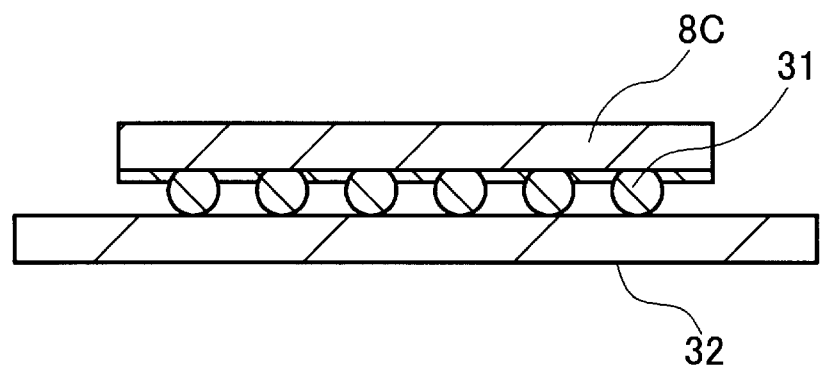
FIG. 11A is a sectional view of a main part of a semiconductor device according to another embodiment of the present invention.
Figure 11B:
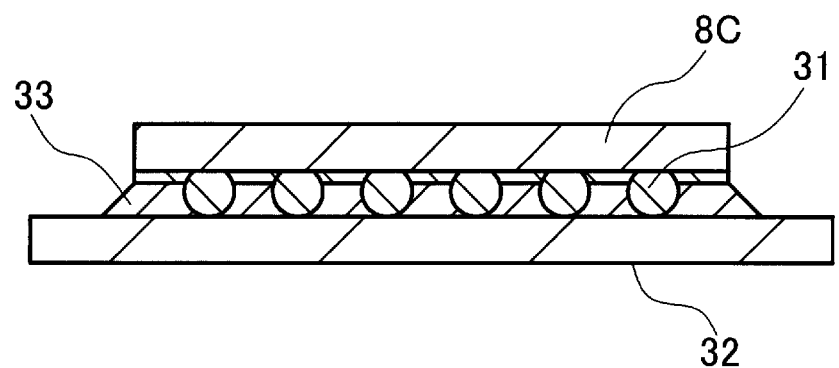
FIG. 11B is another sectional view of a main part of the semiconductor device according to another embodiment of the present invention.

After the steps described above, respective chips 8C are cut out from the wafer 8. As shown in FIGS. 11A and 11B, each chip 8C is mounted on a solder bump electrode 31. The solder bump electrode 31 of the chip 8C is electrically connected to the land of a wiring substrate 32. FIG. 11A illustrates a case in which a filling material (underfill) is not interposed between the chip 8C and the wiring substrate 32 because the molding resin film 28 has sufficient buffering properties. As a matter of course, the filling material may be interposed. FIG. 11B shows a mounting structure used when the molding resin film 28 is not used or when the buffering properties are not sufficient. FIG. 11B illustrates the following case. That is, filling materials 33 made of a liquid resin or the like are interposed between the chip 8C and the wiring substrate 32, and the semiconductor wafer 8 is rigidly fixed to the wiring substrate 32.

As described above, according to the embodiment, when the present invention was applied to a WPP (patterning or the like of relayout wiring), chips having various kinds and sizes could be efficiently mounted.

(Embodiment 10)

In this embodiment, an example in which the present invention is applied to the manufacture of a multi-chip module.

In the embodiment, a memory chip and a logic chip were manufactured through completely different manufacturing processes. As the memory chip, a chip on which a memory circuit such as a DRAM (DYNAMIC RANDOM ACCESS MEMORY), an SRAM (STATIC RANDOM ACCESS MEMORY), a mask ROM, or a flash memory (EEPROM) is mainly formed is known. As a logic chip, a chip on which a logic circuit such as a CPU (CENTRAL PROCESSING UNIT) or a DSP (DIGITAL SIGNAL PROCESSOR) is mainly formed is known.

In the manufacture of a memory chip, since highly integrated micropatterns having a regular arrangement were formed, the illumination condition at the time when the patterns were transferred onto the wafer using the aligner was determined depending on the integration of the patterns. In this case, an orbicular illumination or a special illumination depending on an application was employed. As masks, general masks using a metal such as chromium as a shield member were used in almost all exposure steps.

On the other hand, in the manufacture of a logic chip, a pattern which was smaller than a memory chip was required in a gate circuit area. However, since the integration was not always high, an illumination light source having a large area was used. Since different gate circuits were used depending on the types, the masks described in the above embodiments and the general masks were used properly to manufacture the chip.

Figure 13A:
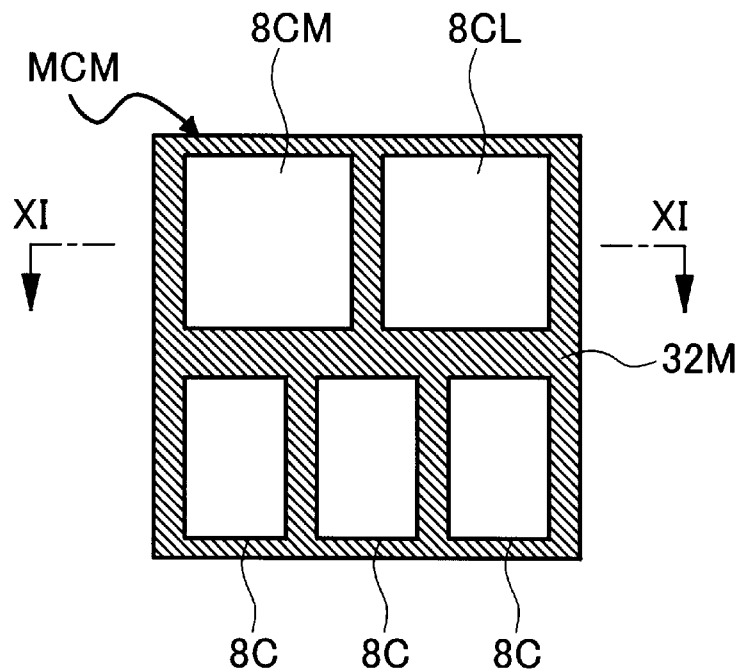
FIG. 13A is a plan view of the semiconductor device in FIG. 12.
Figure 13B:
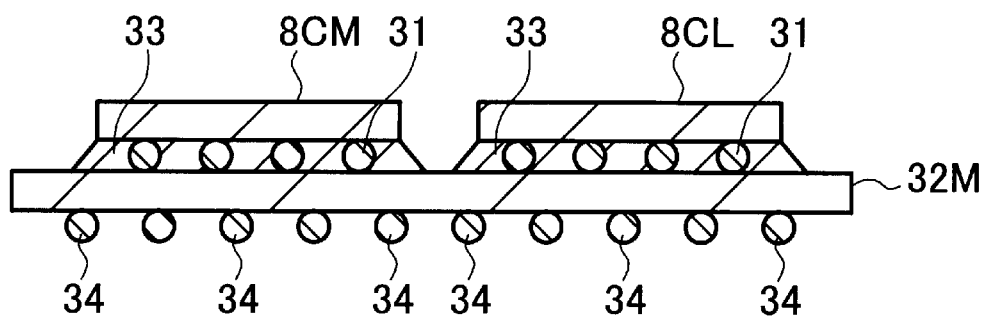
FIG. 13B is a sectional view of the semiconductor device taken along the line X1—X1 in FIG. 13A.
Figure 14:
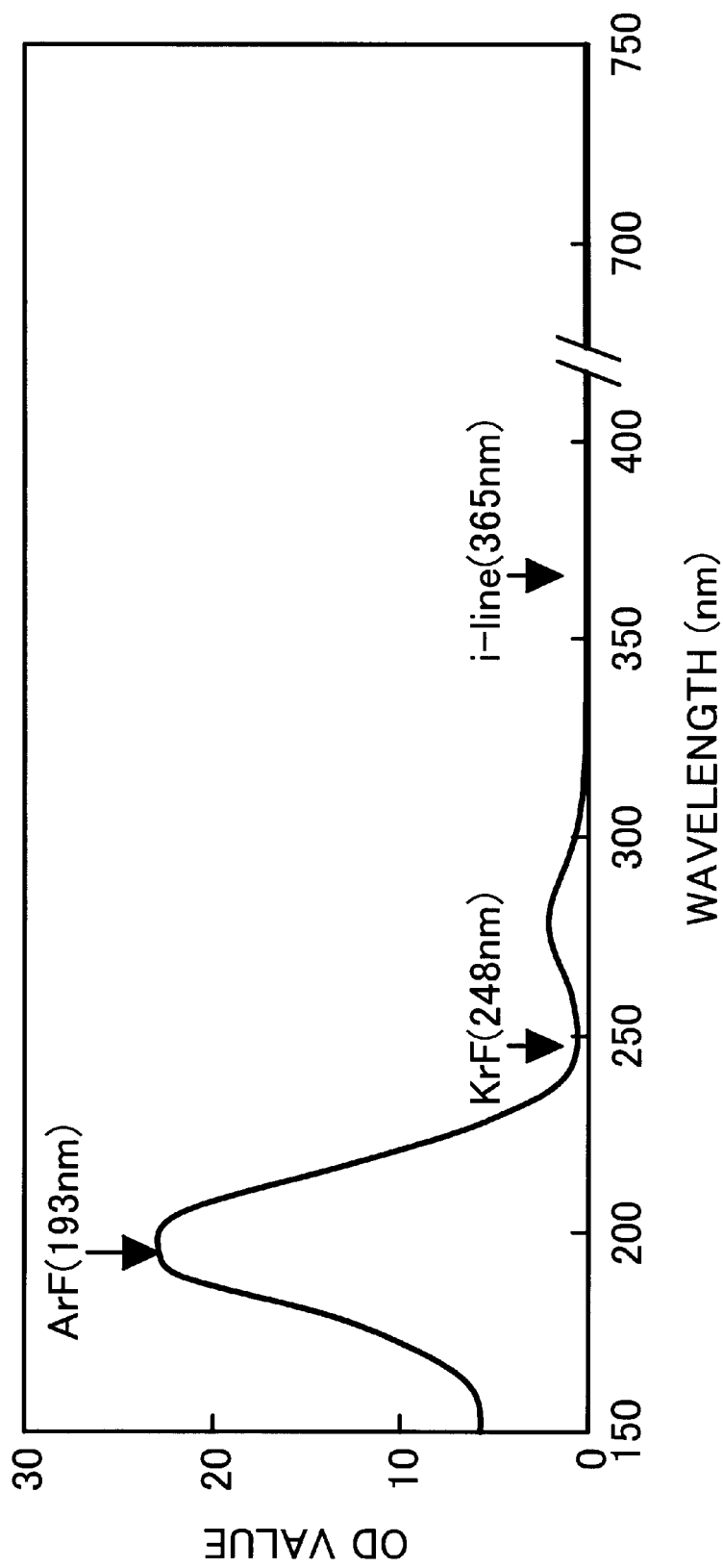
FIG. 14 is a graph showing the spectroscopic characteristics of a typical electron-beam resist using a phenol resin as a base.

As shown in FIG. 12, the above chips of two types were separately manufactured in steps 301a and 301b, respectively, and were arranged on a base substrate (wiring substrate) in step 301. FIG. 13A is a plan view of a multichip module MCM constituted as described above, and FIG. 13B is a cross-section taken along the line X1—X1 in FIG. 13A, which shows an example of the multi chip module MCM.

In the multi chip module MCM, on a base substrate 32M, in addition to a memory chip 8CM and a logic chip 8CL, other chips 8C having various functions are mounted depending on various objects such as an image processing unit, a signal processing unit for a specific application, and the like. In this embodiment, these chips 8C, 8CM, and 8CL were independently manufactured and mounted on one base substrate 32M to manufacture the multi chip module MCM. As the steps of forming the solder bump electrode 31 of the chips 8C, 8CM, and 8CL, the same steps as those in the method in the Embodiment 9 were employed. The solder bump electrode 31 of the chips 8C, 8CM, and 8CL are electrically connected to a land on the major surface of the base substrate 32M, a land on the rear surface of the base substrate 32M through an internal wiring layer in the base substrate 32, and a solder bump electrode 34 which is connected to the land on the rear surface.

According to the embodiment described above, optimum process conditions could be selected for respective chips, and the performances of chips could be improved. For this reason, a high-performance multi chip module MCM could be manufactured.

The invention made by the inventors of this invention has been described with reference to the embodiments. However, the present invention is not limited to these embodiments, and various changes and modification of the invention can be effected without departing from the spirit and scope of the invention.

For example, a photo attenuative pattern of a mask in the embodiments may be removed by peeling. Specifically, after pasting an adhesive tape on the photo attenuative pattern of the mask, the photo attenuative pattern may be removed by peeling the pasted adhesive tape.

In the above description, the invention made by the inventors of this invention is applied to a semiconductor manufacturing method which is an application field serving as the background of the invention. However, the present invention can also be applied to not only the semiconductor device manufacturing method, but also a liquid crystal substrate manufacturing method, a magnetic disk head manufacturing method, and a micromachine manufacturing method.

Effects achieved by a typical one of the inventions disclosed in this application will be briefly described below.

(1) Circuit patterns, alignment marks, and discrimination marks which are formed on photo masks made of the same photo sensitive and photo attenuative material. The step of discriminating the photo masks by using the discrimination marks, the step of aligning the photo masks by using the alignment marks, and the step of transferring a pattern onto a semiconductor wafer by the circuit pattern are performed, thereby the photo masks can be easily discriminated. For this reason, the photo masks can be easily managed.

(2) Circuit patterns, alignment marks, and discrimination marks which are formed on photo masks made of the same photo sensitive and photo attenuative material. The step of discriminating the photo masks by using the discrimination marks, the step of aligning the photo masks by using the alignment marks, and the step of transferring a pattern onto a semiconductor wafer by the circuit pattern are performed, thereby the photo masks can be easily aligned. For this reason, a yield of semiconductor devices can be improved.

What is claimed is:

1. A semiconductor device manufacturing method, in which a circuit pattern, an alignment mark, and a discrimination mark which are formed on a photo mask, are made of the same photo sensitive material, comprising:

(a) the step of discriminating the photo mask by using said discrimination mark;

(b) the step of aligning the photo mask by using said alignment mark; and (c) the step of transferring a pattern onto a semiconductor wafer by using said circuit pattern, wherein said photo sensitive material contains a fine particle material and a binder; and wherein said photo sensitive material contains a photo sensitive resin and a light-absorbing agent.

2. The semiconductor device manufacturing method according to claim 1, wherein a wavelength of exposure light for transferring the circuit pattern of said photo mask is different from a wavelength of light for detecting said discrimination mark in the step of performing discrimination of said photo mask.

3. The semiconductor device manufacturing method according to claim 1, wherein a wavelength of exposure light for transferring said circuit pattern is different from a wavelength of light for detecting said alignment mark in the alignment of said photo mask and also different from a wavelength of light for detecting said discrimination mark in the discrimination of said photo mask.

4. The semiconductor device manufacturing method according to claim 1, wherein a grain size of said fine particle material is not more than 200 mn.

5. The semiconductor device manufacturing method according to claim 1, wherein a content of the fine particle material in said photo sensitive and photo attenuative material is not less than 10% and not more than 99%.

6. A semiconductor device manufacturing method according to claim 1, wherein the fine particle material comprises carbon or graphite.

7. A semiconductor device manufacturing method comprising:

the step of storing a photo mask having a transparent plate and a photo sensitive and photo attenuative material in a stocker;

the step of reading a mark made of said photo sensitive and photo attenuative material to perform mask discrimination of said photo mask;

the step of installing the photo mask to a predetermined exposure unit of an aligner;

the step of detecting the position of an alignment mark made of the photo sensitive and photo attenuative material on said photo mask to perform alignment between the photo mask and a semiconductor wafer;

the step of exposing a desired pattern of said photo mask onto the semiconductor wafer by said aligner; and the step of installing the photo mask to said stocker after said exposure, wherein said photo sensitive and photo attenuative material contains a photo sensitive resin and a light-absorbing agent.

8. The semiconductor device manufacturing method according to claim 7, wherein said photo sensitive and photo attenuative material has a transmittance of not more than 60% with respect to light for discriminating said mask and light for detecting said alignment mark.

9. The semiconductor device manufacturing method according to claim 7, comprising:

the step of deciding whether said photo mask will be used in the future or not after the step of installing the photo mask to said stocker after said exposure;

the step of removing said photo sensitive and photo attenuative material to return to a transparent plate when it is not decided that said photo mask will be used in the future;

the step of cleaning said photo masks;

the step of inspecting the defects on the transparent plate of the photo mask;

the step of coating the photo sensitive and photo attenuative material on the transparent plate;

the step of exposing a desired pattern on said photo sensitive and photo attenuative material;

the step of performing development to form a photo mask having a circuit pattern made of said photo sensitive and photo attenuative material; and the step of installing the photo mask to the stocker to perform exposure again.

10. The semiconductor device manufacturing method according to claim 7, wherein the photo sensitive and photo attenuative material of said photo mask contains at least a fine particle material and a binder, and said transparent plate is a glass plate.

11. The semiconductor device manufacturing method according to claim 10, comprising:

the step of forming a phase shifter structure, which almost inverts a phase of exposure light, on a part of said glass plate of said photo mask; and the step of forming a photo attenuative pattern containing at least said fine particle material and said binder on said phase shifter.

12. The semiconductor device manufacturing method according to claim 10, wherein said photo mask has a phase shifter structure which almost inverts a phase of exposure light transmitted through said photo sensitive and photo attenuative material with respect to exposure light transmitted through an area where said photo sensitive and photo attenuative material is not formed.

13. The semiconductor device manufacturing method according to claim 10, wherein said fine particle material is an inorganic substance.

14. The semiconductor device manufacturing method according to claim 10, wherein said fine particle material is carbon.

15. The semiconductor device manufacturing method according to claim 7, wherein a light transmittance of said photo sensitive and photo attenuative material is 30% or less with respect to light having a wavelength of not less than 150 mn and not more than 750 mn.

16. The semiconductor device manufacturing method according to claim 7, wherein the photo sensitive and photo attenuative material of said photo mask is a resist containing a light-absorbing agent which absorbs light having a wavelength of 230 nm to 750 nm, and said transparent plate is a glass plate.

17. The semiconductor device manufacturing method according to claim 7, wherein the photo sensitive and photo attenuative material of said photo mask is a resist containing a light-absorbing agent which absorbs light having a wavelength of 350 nm to 750 nm, and said transparent plate is a glass plate.

18. A semiconductor device manufacturing method wherein a semiconductor device is manufactured by using a photo mask having (a) a glass plate and (b) a photo sensitive and photo attenuative material which contains a photo sensitive resin and a light-absorbing agent and in which a transmittance with respect to light having a wavelength of 150 nm to 750 nm is not more than 60%.

19. A semiconductor device manufacturing method according to claim 18, wherein the photo sensitive and photo attenuative material contains carbon or graphite.

* * * * *